US012795972B2

(12) United States Patent
Fung et al.

(10) Patent No.: US 12,795,972 B2
(45) Date of Patent: Nov. 10, 2026

(54) FORMATION OF GATE-ALL-AROUND DEVICES AND STRUCTURES THEREOF

(71) Applicant: Taiwan Semiconductor Manufacturing Company, Ltd., Hsinchu (TW)

(72) Inventors: Ka-Hing Fung, Hsinchu County (TW); Huiling Shang, Hsinchu County (TW); Hsueh-Jen Yang, Taipei City (TW); Wei-Yang Lee, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 431 days.

(21) Appl. No.: 18/526,878

(22) Filed: Dec. 1, 2023

(65) Prior Publication Data

US 2025/0185270 A1 Jun. 5, 2025

(51) Int. Cl.
*H10D 30/01* (2025.01)
*H10D 30/43* (2025.01)
(Continued)

(52) U.S. Cl.
CPC ......... *H10D 30/024* (2025.01); *H10D 30/014* (2025.01); *H10D 30/43* (2025.01);
(Continued)

(58) Field of Classification Search
CPC .. H10D 30/503; H10D 30/506; H10D 30/507; H10D 30/508; H10D 30/0195–0197; H10D 30/024; H10D 30/6757; H10D 30/6735; H10D 84/0158; H10D 84/0193; H10D 84/0172; H10D 84/851; H10D 86/011; H10D 64/017
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |

(Continued)

FOREIGN PATENT DOCUMENTS

| | | | |
|---|---|---|---|
| CN | 115207084 A * | 10/2022 | ............ H10P 30/204 |
| TW | 202345238 A | 11/2023 | |

*Primary Examiner* — Joseph C. Nicely
(74) *Attorney, Agent, or Firm* — HAYNES AND BOONE, LLP

(57) ABSTRACT

Methods and structures for inserting disposable interposers include forming a first gate over a first fin and a first spacer layer on sidewalls of the first gate, and a second gate over a second fin and a second spacer layer on sidewalls of the second gate. The method further includes replacing, within the first fin, epitaxial layers of a second composition with disposable interposers disposed beneath the first gate and first inner spacers on opposing ends of the disposable interposers. The method further includes etching back, within the second fin, opposing lateral ends of the epitaxial layers of the second composition to form recesses disposed beneath the second spacer layer and between adjacent epitaxial layers of the first composition. The method further includes forming second inner spacers, within the second fin, within each of the recesses on the opposing lateral ends of the epitaxial layers of the second composition.

20 Claims, 19 Drawing Sheets

PFET

NFET

(51) Int. Cl.

| | |
|---|---|
| ***H10D 30/62*** | (2025.01) |
| ***H10D 30/67*** | (2025.01) |
| ***H10D 62/10*** | (2025.01) |
| ***H10D 64/01*** | (2025.01) |
| ***H10P 50/28*** | (2026.01) |

(52) U.S. Cl.
CPC ..... *H10D 30/6215* (2025.01); *H10D 30/6735* (2025.01); *H10D 30/6757* (2025.01); *H10D 62/121* (2025.01); *H10D 64/017* (2025.01); *H10P 50/283* (2026.01)

(56) References Cited

U.S. PATENT DOCUMENTS

| | | | | |
|---|---|---|---|---|
| 8,963,258 | B2 | 2/2015 | Yu et al. | |
| 9,093,530 | B2 | 7/2015 | Huang et al. | |
| 9,171,929 | B2 | 10/2015 | Lee et al. | |
| 9,214,555 | B2 | 12/2015 | Oxland et al. | |
| 9,236,267 | B2 | 1/2016 | De et al. | |
| 9,520,482 | B1 | 12/2016 | Chang et al. | |
| 9,548,303 | B2 | 1/2017 | Lee et al. | |
| 9,576,814 | B2 | 2/2017 | Wu et al. | |
| 2013/0285116 | A1 | 10/2013 | Lochtefeld et al. | |
| 2018/0076095 | A1 | 3/2018 | Cheng | |
| 2019/0287864 | A1* | 9/2019 | Cheng .................... | B82Y 10/00 |
| 2020/0083352 | A1 | 3/2020 | Chanemougame | |
| 2023/0178628 | A1 | 6/2023 | Colombeau | |

* cited by examiner

NFET

PFET

NFET

PFET

NFET

PFET

NFET

PFET

NFET

PFET

NFET

PFET

NFET

PFET

NFET

PFET

NFET

PFET

NFET

PFET

NFET

PFET

NFET

PFET

NFET

PFET

NFET

PFET

PFET

NFET

NFET

PFET

NFET

PFET

FORMATION OF GATE-ALL-AROUND DEVICES AND STRUCTURES THEREOF

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA transistors get their name from the gate structure which extends completely around the channel, providing better electrostatic control than FinFETs. FinFETs and GAA transistors are compatible with conventional complementary metal-oxide-semiconductor (CMOS) processes and their three-dimensional structure allows them to be aggressively scaled while maintaining gate control and mitigating SCEs.

In general, GAA transistors may be implemented, for example, in cases where FinFETs can no longer meet performance requirements. However, fabrication of GAA transistors has introduced new challenges to the semiconductor manufacturing process and has led to associated device reliability concerns. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
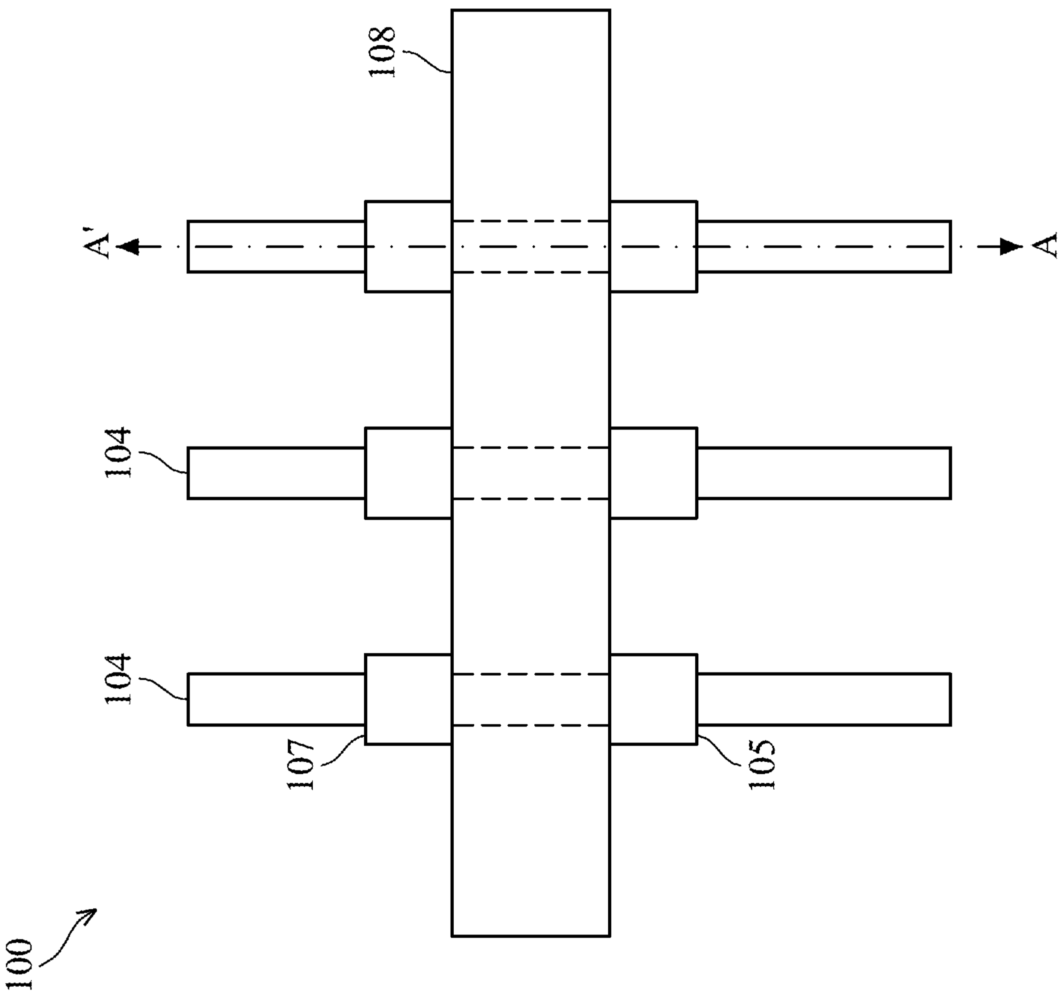
FIG. 1 provides a simplified top-down layout view of a multi-gate device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Additionally, in the discussion that follows, dimensions (e.g., such as thickness, width, length, etc.) for a given layer or other feature may at times be described using terms such as "substantially equal", "equal", or "about", where such terms are understood to mean within +/−10% of the recited value or between compared values. For instance, if dimension A is described as being "substantially equal" to dimension B, it will be understood that dimension A is within +/−10% of dimension B. As another example, if a layer is described as having a thickness of about 100 nm, it will be understood that the thickness of the layer may in a range between 90-110 nm.

It is also noted that the present disclosure presents embodiments in the form of multi-gate transistors. Multi-gate transistors include those transistors whose gate structures are formed on at least two-sides of a channel region. These multi-gate devices may include a P-type transistor or an N-type transistor. Specific examples may be presented and referred to herein as gate-all-around (GAA) transistors. GAA transistors include any device that has its gate structure, or portion thereof, formed on 4-sides of a channel region (e.g., surrounding a portion of a channel region). Devices presented herein also include embodiments that have channel regions disposed in semiconductor channel layers. In various embodiments, the semiconductor channel layers may include nanosheet channel(s), nanowire channel(s), bar-shaped channel(s), and/or other suitable channel configurations. Presented herein are embodiments of devices that may have one or more channel regions (e.g., semiconductor channel layers) associated with a single, contiguous gate structure. However, one of ordinary skill would recognize that the teaching can apply to a single channel (e.g., single semiconductor channel layer) or any number of channels. One of ordinary skill may recognize other examples of semiconductor devices that may benefit from aspects of the present disclosure.

A silicon/silicon germanium (Si/SiGe) superlattice, including Si channel layers interposed by sacrificial SiGe layers (or SiGe interposers), may be formed as part of a GAA transistor fabrication process. In an example, the SiGe interposers (or portions thereof) are removed after a source/drain epitaxial growth process and subsequently replaced by a gate structure disposed in a channel region between adjacent Si channel layers. In addition, inner spacers are formed between lateral ends of the adjacent Si channel layers, and between an epitaxial source/drain feature and the gate structure disposed in the channel region. Prior to removing the SiGe interposers, and due to dopant diffusion (e.g., such as diffusion of Ge) occurring as a result of processing, an undesirable SiGe/Si intermix layer may form at an interface between the Si interposers and the Si channel layers, and along interfaces adjacent to the inner spacers. Such an intermix layer, as well as high built-in stress that can be caused by the presence of the SiGe layer, can negatively impact GAA transistor performance. Even after the SiGe interposers are replaced by the gate structure, Ge residue may still be present at corners between the gate structure, Si channel layers, and inner spacers, which can induce interface traps and degrade device mobility. The resulting dog-bone structure of the Si channel layers adjacent to the inner spacers can also result in higher fringing capacitance, which can further degrade device performance. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for inserting a disposable interposer between semiconductor channel layers of GAA transistors to address existing challenges. The difficulties related to SiGe interposers, as discussed above, predominantly impact P-type GAA transistors (or PFETs). For N-type GAA transistors (or NFETs), the use of SiGe interposers may, in some cases, serve to provide enhanced tensile stress in the Si channel layers, thereby improving device performance. Thus, in accordance with some embodiments, SiGe interposers may be replaced with disposable interposers (e.g., such as an oxide or other dielectric material) for P-type GAA transistors but not for N-type GAA transistors. To be sure, in some cases, SiGe interposers may be replaced with disposable interposers for both P-type GAA transistors and N-type GAA transistors. In still other examples, SiGe interposers may be replaced with disposable interposers for N-type GAA transistors but not for P-type GAA transistors.

In some embodiments, a method of inserting a disposable interposer between semiconductor channel layers of GAA transistors includes initially removing SiGe layers that interpose adjacent semiconductor channel layers (e.g., such as by a wet etching process) and re-depositing an oxide or other dielectric material layer to conformally fill the cavity formed by removal of the SiGe layers. Thereafter, a recessing process is performed to recess the deposited oxide or other dielectric material layer to form an inner spacer recess between lateral ends of adjacent semiconductor channel layers. In some embodiments, the recessing process includes a vapor dilute hydrofluoric (dHF) acid etch performed using a CERTAS® Gas Chemical Etch System, available from Tokyo Electron Limited, Tokyo, Japan. Afterwards, an inner spacer material is deposited and etched-back (e.g., using a dry etching process) to complete formation of the inner spacer. After formation of the inner spacer, epitaxial source/drain features are formed, and the remaining oxide or other dielectric material layer is removed to form gaps between adjacent semiconductor channel layers within which a metal gate structure is subsequently formed.

By replacing SiGe interposers with disposable interposers (e.g., such as an oxide or other dielectric material), embodiments of the GAA transistors disclosed herein prevent formation of a SiGe/Si intermix layer (e.g., by removal of Ge diffusion source), reduce interface traps (e.g., by avoiding formation of Ge residue at corners between the gate structure, Si channel layers, and inner spacers), provide higher mobility and drive current, reduce fringing capacitance (e.g., by minimizing formation of a dog-bone structure of the Si channel layers), provide enhanced control of short-channel effects (SCEs), and provide enhanced compressive stress in the Si channel layers (e.g., for P-type GAA transistors), thereby improving device performance. For N-type GAA transistors, in some embodiments and as noted above, SiGe interposers may continue to be used to provide enhanced tensile stress in the Si channel layers. Other embodiments and advantages will be evident to those skilled in the art upon reading the present disclosure.

For purposes of the discussion that follows, FIG. 1 provides a simplified top-down layout view of a multi-gate device 100. In various embodiments, the multi-gate device 100 may include a GAA transistor. The multi-gate device 100 may include a plurality of fin elements 104 extending from a substrate, a gate structure 108 disposed over and around the fin elements 104, and source/drain regions 105, 107, where the source/drain regions 105, 107 are formed in, on, and/or surrounding the fins 104. A channel region of the multi-gate device 100, which may include a plurality of semiconductor channel layers, is disposed within the fins 104, underlying the gate structure 108, along a plane substantially parallel to a plane defined by section AA' of FIG. 1. In some embodiments, sidewall spacers may also be formed on sidewalls of the gate structure 108. Various other features of the multi-gate device 100 are discussed in more detail below with reference to the method of FIG. 2.

Figure 2:
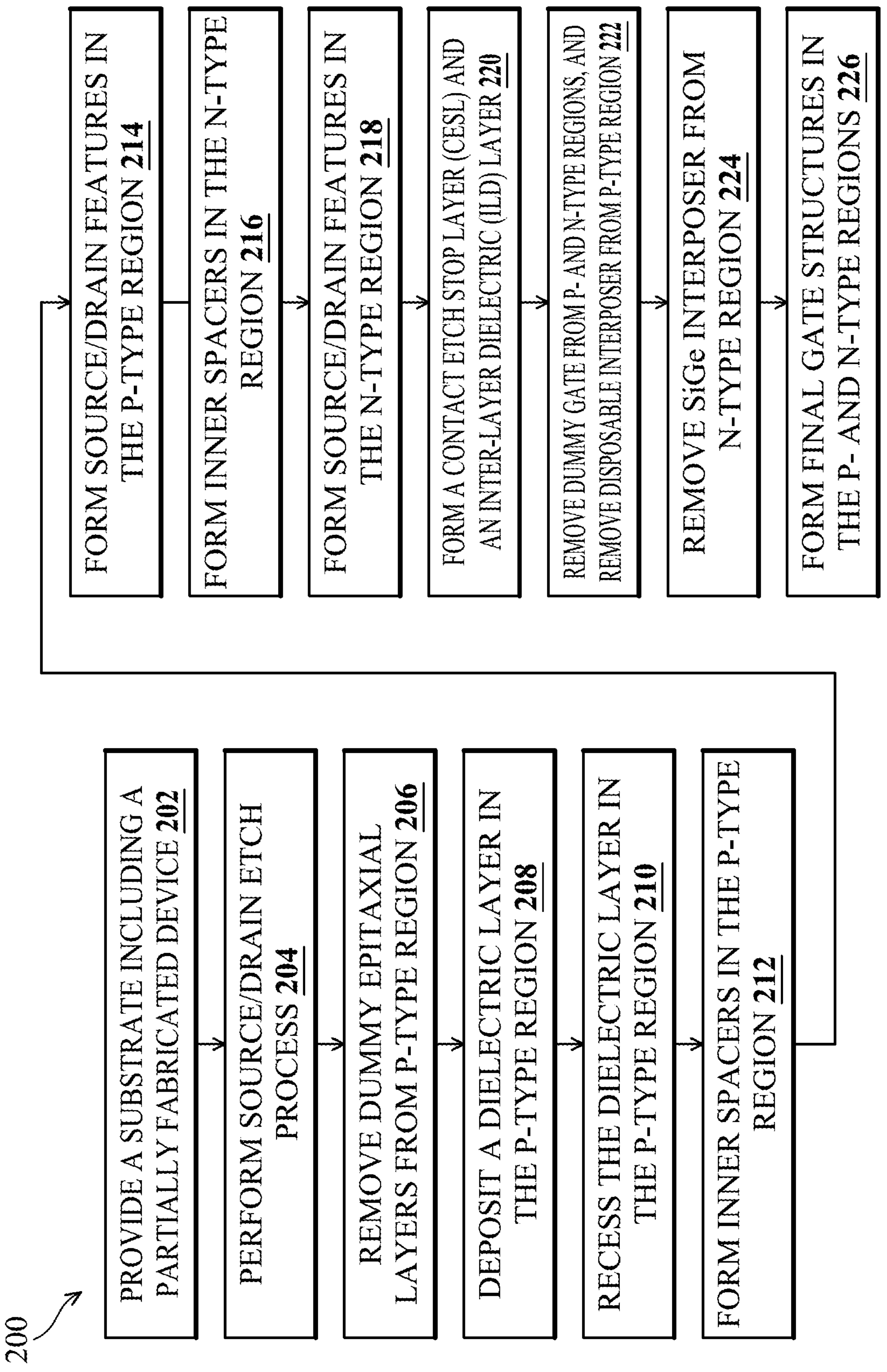
FIG. 2 is a flow chart of a method of fabricating a semiconductor device 300, including a P-type device 300A and an N-type device 300B, according to one or more aspects of the present disclosure.

Referring to FIG. 2, illustrated therein is a method 200 of semiconductor fabrication including fabrication of a semiconductor device 300 (e.g., which includes a multi-gate device) in which SiGe interposers are replaced with disposable interposers, in accordance with various embodiments. The method 200 is discussed below with reference to fabrication of GAA transistors. However, it will be understood that aspects of the method 200 may be equally applied to other types of multi-gate devices, or to other types of devices implemented by the multi-gate devices, without departing from the scope of the present disclosure. In some embodiments, the method 200 may be used to fabricate the multi-gate device 100, described above with reference to FIG. 1. Thus, one or more aspects discussed above with reference to the multi-gate device 100 may also apply to the method 200. It is understood that the method 200 includes steps having features of a complementary metal-oxide-semiconductor (CMOS) technology process flow and thus, are only described briefly herein. Also, additional steps may be performed before, after, and/or during the method 200.

It is further noted that, in some embodiments, the semiconductor device 300 may include various other devices and features, such as other types of devices such as additional transistors, bipolar junction transistors, resistors, capacitors, inductors, diodes, fuses and/or other logic circuits, etc., but is simplified for a better understanding of the inventive concepts of the present disclosure. In some embodiments, the semiconductor device 300 may include a plurality of semiconductor devices (e.g., transistors) which may be interconnected. Moreover, it is noted that the process steps of method 200, including any descriptions given with reference to the figures are merely exemplary and are not intended to be limiting beyond what is specifically recited in the claims that follow.

The method 200 begins at block 202 where a substrate including a partially fabricated device is provided. Referring to the example of FIGS. 3A/3B, in an embodiment of block 202, a partially fabricated device 300 is provided. In the examples shown, the partially fabricated device 300 includes a P-type device 300A formed in a P-type device region and an N-type device 300B formed in an N-type device region. In particular, FIGS. 3A-19A provide cross-sectional views of embodiments of the P-type device 300A along a plane substantially parallel to a plane defined by section AA' of FIG. 1 (e.g., along the direction of a fin 306), at various stages of processing in accordance with the method 200. Similarly, FIGS. 3B-19B provide cross-sectional views of embodiments of the N-type device 300B along a plane substantially parallel to a plane defined by section AA' of FIG. 1 (e.g., along the direction of a fin 306), at various stages of processing in accordance with the method 200.

The device 300, including each of the P-type device 300A and the N-type device 300B, may be formed on a substrate 304. In some embodiments, the substrate 304 may be a semiconductor substrate such as a silicon substrate. The substrate 304 may include various layers, including conductive or insulating layers formed on a semiconductor substrate. The substrate 304 may include various doping configurations depending on design requirements as is known in the art. The substrate 304 may also include other semiconductors such as germanium, silicon carbide (SiC), silicon germanium (SiGe), or diamond. Alternatively, the substrate 304 may include a compound semiconductor and/or an alloy semiconductor. Further, the substrate 304 may optionally include an epitaxial layer (epi-layer), may be strained for performance enhancement, may include a silicon-on-insulator (SOI) structure, and/or have other suitable enhancement features.

Figure 3B:
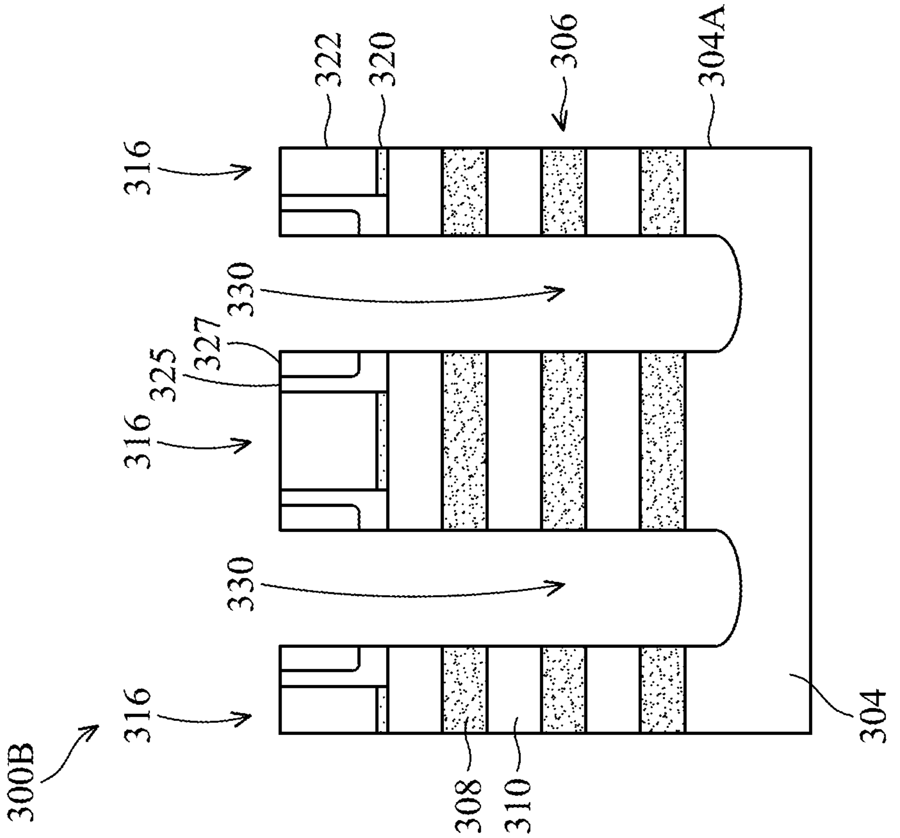
FIGS. 3B, 4B, 5B, 6B, 7B, 8B, 9B, 10B, 11B, 12B, 13B, 14B, 15B, 16B, 17B, 18B, and 19B provide cross-sectional views of embodiments of the N-type device 300B along a plane substantially parallel to a plane defined by section AA' of FIG. 1, at various stages of processing in accordance with the method 200, in accordance with some embodiments.
Figure 3A:
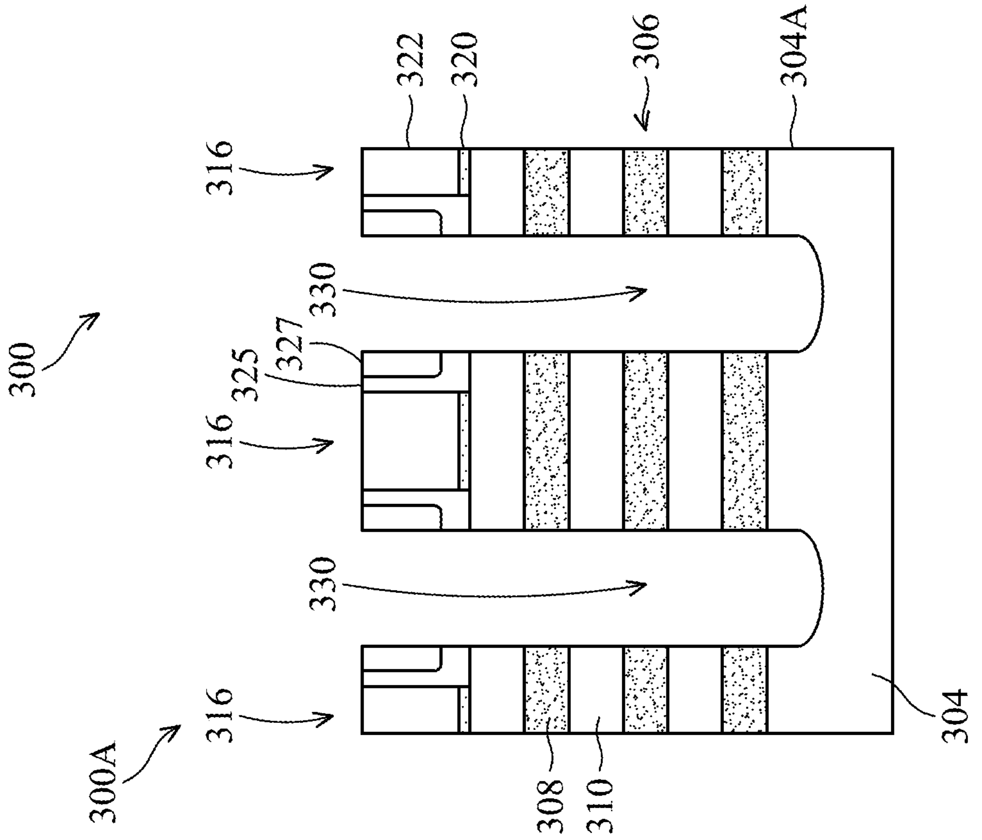
FIGS. 3A, 4A, 5A, 6A, 7A, 8A, 9A, 10A, 11A, 12A, 13A, 14A, 15A, 16A, 17A, 18A, and 19A provide cross-sectional views of embodiments of the P-type device 300A along a plane substantially parallel to a plane defined by section AA' of FIG. 1, at various stages of processing in accordance with the method 200, in accordance with some embodiments.

As shown in FIGS. 3A/3B, each of the P-type device 300A and the N-type device 300B include a fin 306 having a substrate portion 304A (formed from the substrate 304), epitaxial layers 308 of a first composition and epitaxial layers 310 of a second composition that interpose the layers 308 of the first composition. In some cases, shallow trench isolation (STI) features may be formed to isolate the fins 306 from neighboring fins. For purposes of this discussion, the epitaxial layers 308 of the first composition include dummy layers (also referred to as sacrificial layers or interposers), and the epitaxial layers 310 of the second composition include semiconductor channel layers. In an embodiment, the epitaxial layers 308 of the first composition include SiGe (e.g., to provide SiGe interposers) and the epitaxial layers of the second composition 310 include silicon (Si) (e.g., to provide Si channel layers). It is also noted that while the layers 308, 310 are shown as having a particular stacking sequence within the fins 306, where the layer 310 is the topmost layer of the stack of layers 308, 310 for each of the P-type device 300A and the N-type device 300B, other configurations are possible. For example, in some cases, the layer 308 may alternatively be the topmost layer of the stack of layers 308, 310 for one or both of the P-type device 300A and the N-type device 300B. Stated another way, the order of growth for the layers 308, 310, and thus their stacking sequence, may be switched or otherwise be different than what is shown in the figures, while remaining within the scope of the present disclosure.

In various embodiments, the epitaxial layers 310 (e.g., including the second composition), or portions thereof, may form a channel region of a GAA transistor for the P-type device 300A and the N-type device 300B. For example, the layers 310 may be referred to as semiconductor channel layers that are used to form a channel region of a GAA transistor. In various embodiments, the semiconductor channel layers (e.g., the layers 310 or portions thereof) may include nanosheet channel(s), nanowire channel(s), bar-shaped channel(s), and/or other suitable channel configurations. The semiconductor channel layers may also be used to form portions of the source/drain features of a GAA transistor for the P-type device 300A and the N-type device 300B, in some embodiments.

It is noted that while the fins 306 are illustrated as including three (3) layers of the epitaxial layer 308 and three (3) layers of the epitaxial layer 310, this is for illustrative purposes only and not intended to be limiting beyond what is specifically recited in the claims. It can be appreciated that any number of epitaxial layers can be formed, where for example, the number of epitaxial layers depends on the desired number of semiconductor channel layers of a GAA transistor for the P-type device 300A and the N-type device 300B. In some embodiments, the number of epitaxial layers 310, and thus the number of semiconductor channel layers, is between 3 and 10. In some examples, the number of epitaxial layers 308 and the number of epitaxial layers 310 may be different for each of the P-type device 300A and the N-type device 300B. In some examples, the number of epitaxial layers 308 and the number of epitaxial layers 310 may be the same for each of the P-type device 300A and the N-type device 300B.

In some embodiments, the epitaxial layers 308 (the dummy/sacrificial/interposer layers) each have a thickness in a range of about 3-8 nanometers (nm). In some cases, the epitaxial layers 310 (the semiconductor channel layers) each have a thickness in a range of about 8-12 nm. As noted above, the epitaxial layers 310 may serve as channel region(s) for a subsequently formed multi-gate device (e.g., a GAA transistor) and its thickness may be chosen based at least in part on device performance considerations. The epitaxial layers 308 may serve to define a gap distance between adjacent channel region(s) for the subsequently formed multi-gate device and its thickness may also be chosen based at least in part on device performance considerations. In some examples, thicknesses of the epitaxial layers 308 and the epitaxial layers 310 may be different for each of the P-type device 300A and the N-type device 300B. In other examples, thicknesses of the epitaxial layers 308 and the epitaxial layers 310 may be the same for each of the P-type device 300A and the N-type device 300B.

The P-type device 300A and the N-type device 300B further include gate stacks 316 formed over the fins 306. In an embodiment, the gate stacks 316 are dummy (sacrificial) gate stacks that are subsequently removed and replaced by a final gate stack at a subsequent processing stage of the P-type device 300A and the N-type device 300B. For example, the gate stacks 316 may be replaced at a later processing stage by a high-K dielectric layer (HK) and metal gate electrode (MG). While the present discussion is directed to a replacement gate (gate-last) process whereby a dummy gate structure is formed and subsequently replaced, other configurations may be possible (e.g., such as a gate-first process). The portion of the fins 306 underlying the gate stacks 316 may be referred to as the channel region of the P-type device 300A and the N-type device 300B. The gate stacks 316 may also define source/drain regions of the fins 306, for example, the regions of the fins 306 adjacent to and on opposing sides of the channel region.

In some embodiments, the gate stacks 316 include a dielectric layer 320 and an electrode layer 322 over the dielectric layer 320. In some embodiments, the dielectric layer 320 includes silicon oxide. Alternatively, or additionally, the dielectric layer 320 may include silicon nitride, a high-K dielectric material or other suitable material. In some embodiments, the electrode layer 322 may include polycrystalline silicon (polysilicon). In some embodiments, and after formation of the gate stacks 316, one or more spacer layers 325, 327 may be formed on sidewalls of the gate stacks 316. In some cases, the one or more spacer layers 325, 327 may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. In some embodiments, the one or more spacer layers 325, 327 include multiple layers, such as main spacer layers, liner layers, and the like.

The method 200 then proceeds to block 204 where a source/drain etch process is performed. Still with reference to FIGS. 3A/3B, in an embodiment of block 204, a source/drain etch process is performed to each of the P-type device 300A and the N-type device 300B. In some embodiments, the source/drain etch process is performed to remove the exposed epitaxial layers 308, 310 in source/drain regions of each of the P-type device 300A and the N-type device 300B to form trenches 330 which expose underlying portions of the substrate 304. The source/drain etch process (and the trenches 330) also serves to expose lateral surfaces of the epitaxial layers 308, 310, as shown in FIGS. 3A/3B. In some embodiments, the source/drain etch process may also remove portions of the one or more spacer layers 325, 327. In some embodiments, the source/drain etch process may include a dry etching process, a wet etching process, and/or a combination thereof.

The method proceeds to block 206 where dummy epitaxial layers are removed from the P-type device region. Referring to the example of FIGS. 3A/3B and FIGS. 4A/4B, in an embodiment of block 206, a patterned photoresist (resist) layer 404 is initially formed over the N-type device region (including over the N-type device 300B), while the P-type device region (including the P-type device 300A) is exposed. By way of example, formation of the patterned resist layer 404 may include forming a resist layer over the device 300 (including over each of the P-type device 300A and the N-type device 300B), exposing the resist to a pattern (e.g., as defined by a photomask), performing post-exposure bake processes, and developing the exposed resist to form the patterned resist layer 404.

In some embodiments, after formation of the patterned resist layer 404, and in a further embodiment of block 206, the dummy epitaxial layers (e.g., the epitaxial layers 308 or SiGe interposers) are selectively removed (e.g., using a selective etching process) from the P-type device 300A, while the semiconductor channel layers (the epitaxial layers 310) of the P-type device 300A remain substantially unetched, and while the N-type device 300B remains masked by the patterned resist layer 404. In various examples, the selective removal of the dummy epitaxial layers (or SiGe interposers) completely removes the epitaxial layers 308 from the P-type device 300A, thereby eliminating the possibility of Ge diffusion and/or Ge residue remaining after subsequent device processing. However, in some embodiments, such Ge diffusion and/or Ge residue may remain present in the N-type device 300B, which may still use the SiGe interposers). The selective etching process to remove the epitaxial layers 308 from the P-type device 300A may be performed through the trenches 330 provided by the source/drain etch process (block 204). In some embodiments, the selective etching process may include a selective wet etching process. In some cases, the selective wet etching includes ammonia ($NH_3$) and/or ozone ($O_3$). As merely one example, the selective wet etching process includes tetra-methyl ammonium hydroxide (TMAH). In some embodiments, the selective etching process may include a dry, plasma-free etching process performed using a CERTAS® Gas Chemical Etch System, available from Tokyo Electron Limited, Tokyo, Japan. In some examples, the selective etching process may include etching using a standard clean 1 (SC-1) solution, a solution of ammonium hydroxide ($NH_4OH$), hydrogen peroxide ($H_2O_2$) and water ($H_2O$), hydrofluoric acid (HF), buffered HF, and/or a fluorine ($F_2$)-based etch. In some examples, the $F_2$-based etch may include an $F_2$ remote plasma etch. It is noted that as a result of the selective removal of the dummy epitaxial layers or SiGe interposers (the epitaxial layers 308), gaps (or cavities) 402 are formed between the adjacent semiconductor channel layers (the epitaxial layers 310) of the P-type device 300A. In some embodiments, and after removal of the dummy epitaxial layers from the P-type device region (block 206), the epitaxial layers 310 may remain substantially rectangular shaped. As a result, formation of a dog-bone structure of the epitaxial layers 310 (semiconductor channel layers) can be mitigated and the associated fringing capacitance can be reduced.

Figure 4B:
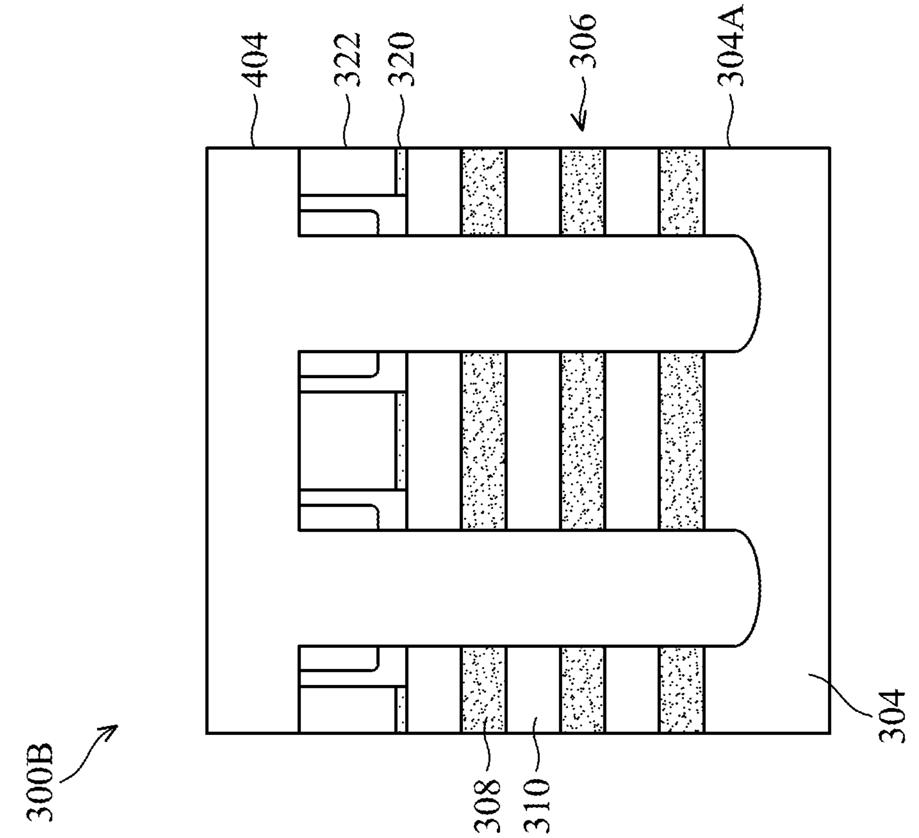
Figure 4A:
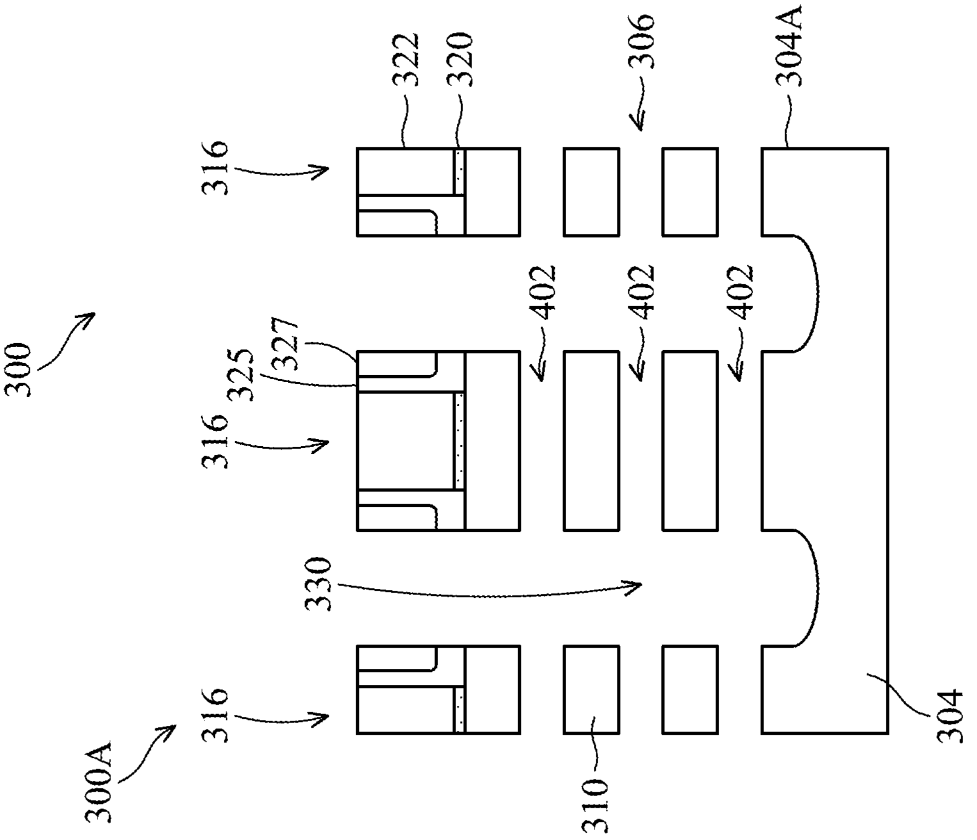

After removal of the dummy epitaxial layers from the P-type device region (block 206), the method 200 then proceeds to block 208 where a dielectric layer is deposited in the P-type device region. Referring to FIGS. 4A/4B and FIGS. 5A/5B, in an embodiment of block 208, a dielectric layer 502 is conformally deposited over the device 300. In particular, the dielectric layer 502 is conformally deposited within the trenches 330 of the P-type device 300A and within the gaps (or cavities) 402 that were previously formed between the adjacent semiconductor channel layers (the epitaxial layers 310) of the P-type device 300A. In some embodiments, the dielectric layer 502 may be deposited such that it completely fills the gaps (or cavities) 402. As shown, and in some cases, the dielectric layer 502 may also be deposited over the patterned resist layer 404, which serves to mask and protect the N-type device 300B.

In some embodiments, the dielectric layer 502 may include an oxygen-containing layer (e.g., including an oxide layer such as $SiO_2$), a nitrogen-containing layer (e.g., including a nitride layer such as SiN), an oxygen-and-nitrogen-containing layer such as silicon oxynitride (SiON), a metal oxide such as aluminum oxide ($Al_2O_3$), a carbon-containing layer such as silicon carbide (SiC), silicon carbon nitride (SiCN), silicon oxycarbide (SiOC), or silicon oxycarbonitride (SiOCN), a low-K material (e.g., with a dielectric constant 'k'<7), and/or combinations thereof. In some cases, the dielectric layer 502 may be conformally deposited using processes such as an ALD process, a CVD process, or other suitable process. In various examples, the dielectric layer 502 may have a thickness in a range of 3-8 nm. In accordance with embodiments of the present disclosure, the dielectric layer 502 may serve as a disposable interposer, as discussed further herein.

Figure 5B:
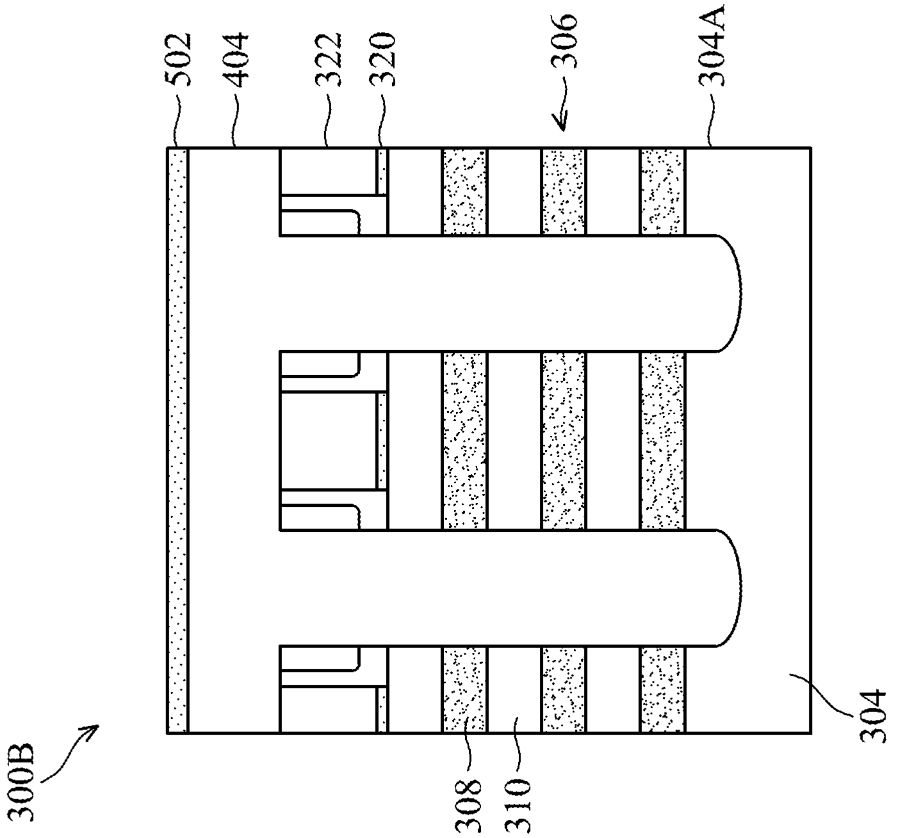
Figure 5A:
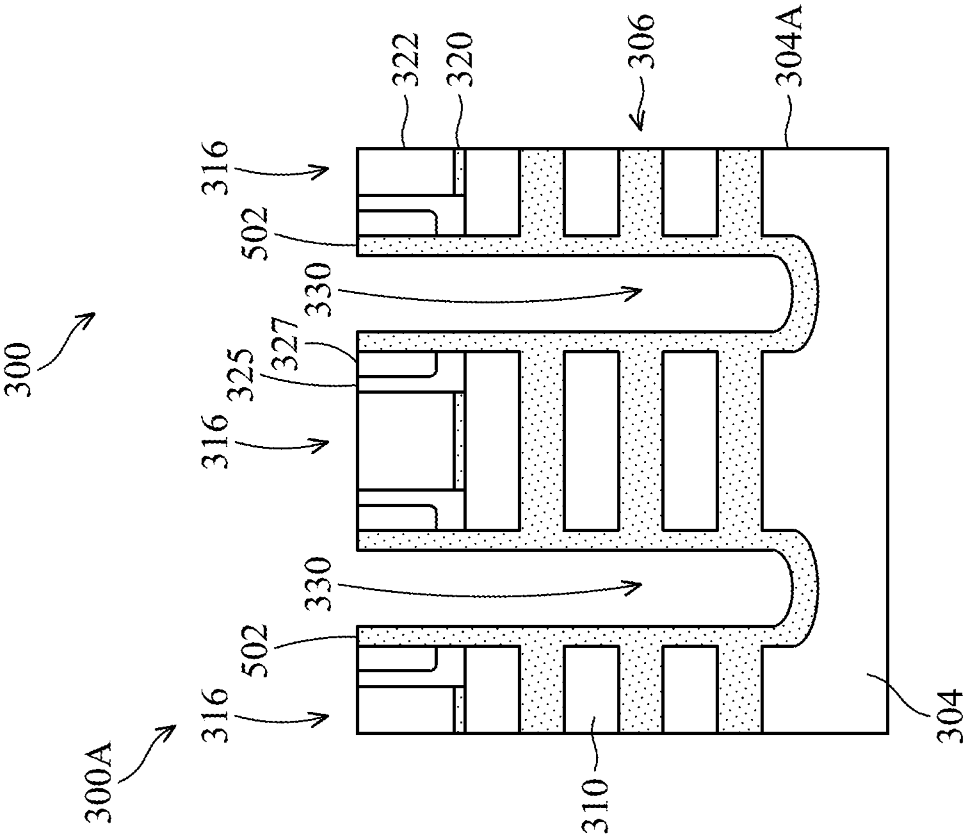

The method 200 then proceeds to block 210 where the dielectric layer previously deposited in the P-type device region is recessed. Referring to FIGS. 5A/5B and FIGS. 6A/6B, in an embodiment of block 210, a recessing process is performed to the device 300. In particular, and in various examples, the recessing process etches the dielectric layer 502 from over a top surface of the P-type device 300A and from over a top surface of the patterned resist layer 404 disposed on the N-type device 300B (the N-type device 300B being otherwise protected by the patterned resist layer 404). Further, the recessing process etches the dielectric layer 502 from along sidewalls of the trenches 330 of the P-type device 300A and at least partially etches the dielectric layer 502 from between lateral ends of the adjacent semiconductor channel layers (the epitaxial layers 310) of the P-type device 300A to form recesses 604, while the dielectric layer 502 remains at least partially disposed between the adjacent semiconductor channel layers (the epitaxial layers 310) of the P-type device 300A. The portions of the dielectric layer 502 that remain between the adjacent semiconductor channel layers will serve as disposable interposers, having effectively replaced the SiGe interposers (epitaxial layers 308) previously disposed between the semiconductor channel layers (epitaxial layers 310) of the P-type device 300A. During a later stage of processing, as discussed below, the disposable spacers will be removed and replaced by a portions of a gate structure (e.g., a metal gate structure) that interface respective adjacent inner spacers. In some examples, such as when the dielectric layer 502 includes an oxide layer, the recessing process (block 210) includes a vapor dilute hydrofluoric (dHF) acid etch performed using a CERTAS® Gas Chemical Etch System, available from Tokyo Electron Limited, Tokyo, Japan. In some embodiments, the recessing process (block 210) may be performed using a wet etch process such as a phosphoric acid ($H_3PO_4$) chemical etch of the dielectric layer 502. In some alternative examples, cycles of a high temperature sulfuric peroxide mixture (HTSPM) and dilute hydrofluoric acid (dHF), ozone ($O_3$) and dHF, or a combination thereof, may be used to perform the recessing process.

Figure 6B:
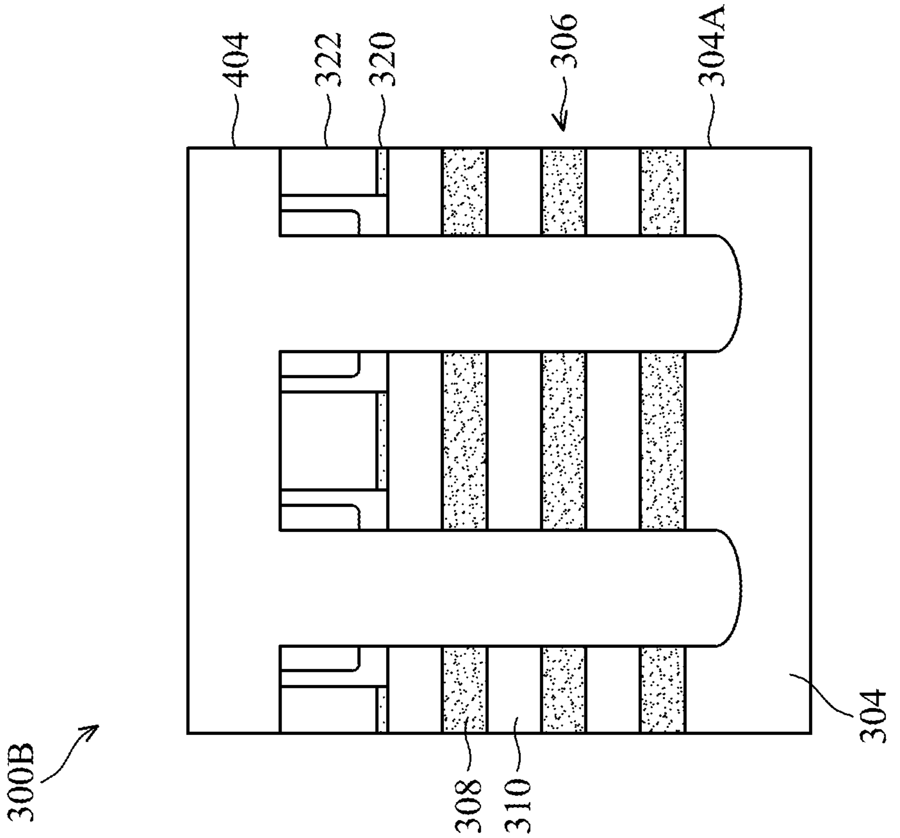
Figure 6A:
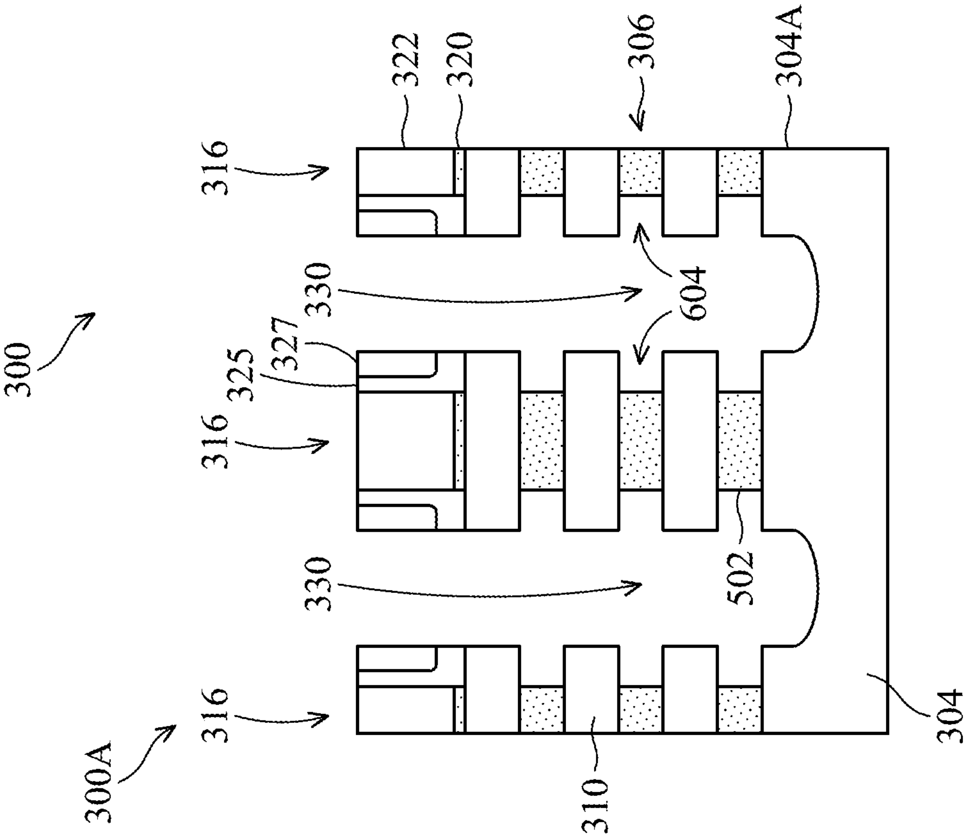

The method 200 then proceeds to block 212 where inner spacers are formed in the P-type device region. Referring to FIGS. 6A/6B and FIGS. 7A/7B, in an embodiment of block 212, an inner spacer material 702 is initially conformally deposited over the device 300. In particular, the inner spacer material 702 is conformally deposited within the trenches 330 of the P-type device 300A and within the recesses 604 (e.g., formed by recessing the dielectric layer 502 at block 210) of the P-type device 300A. The conformally deposited inner spacer material 702 may substantially fill the recesses 604, contacting lateral surfaces of the recessed dielectric layers 502 (the disposable interposers). In some embodiments, the inner spacer material 702 may include amorphous silicon. In some examples, the inner spacer material 702 may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. By way of example, the inner spacer material 702 may be formed by conformally depositing the inner spacer material 702 over the device 300 using processes such as a an ALD process, a CVD process, or other suitable process. As shown, and in some cases, the inner spacer material 702 may also be deposited over the patterned resist layer 404, which serves to mask and protect the N-type device 300B.

Figure 7B:
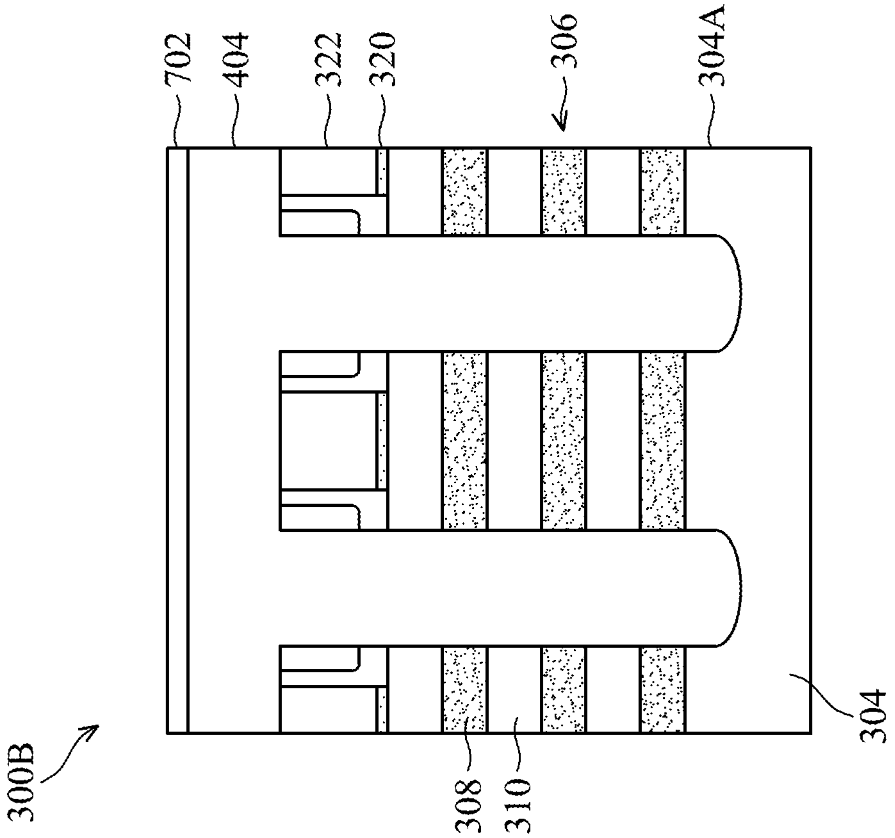
Figure 7A:
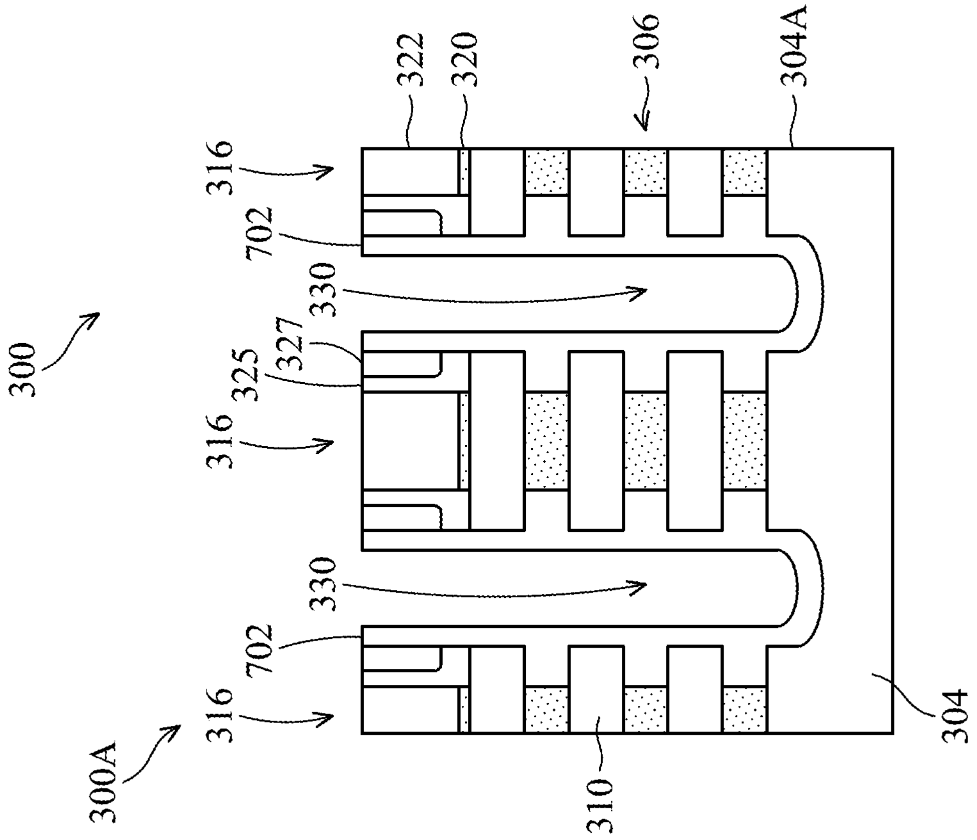
Figure 8B:
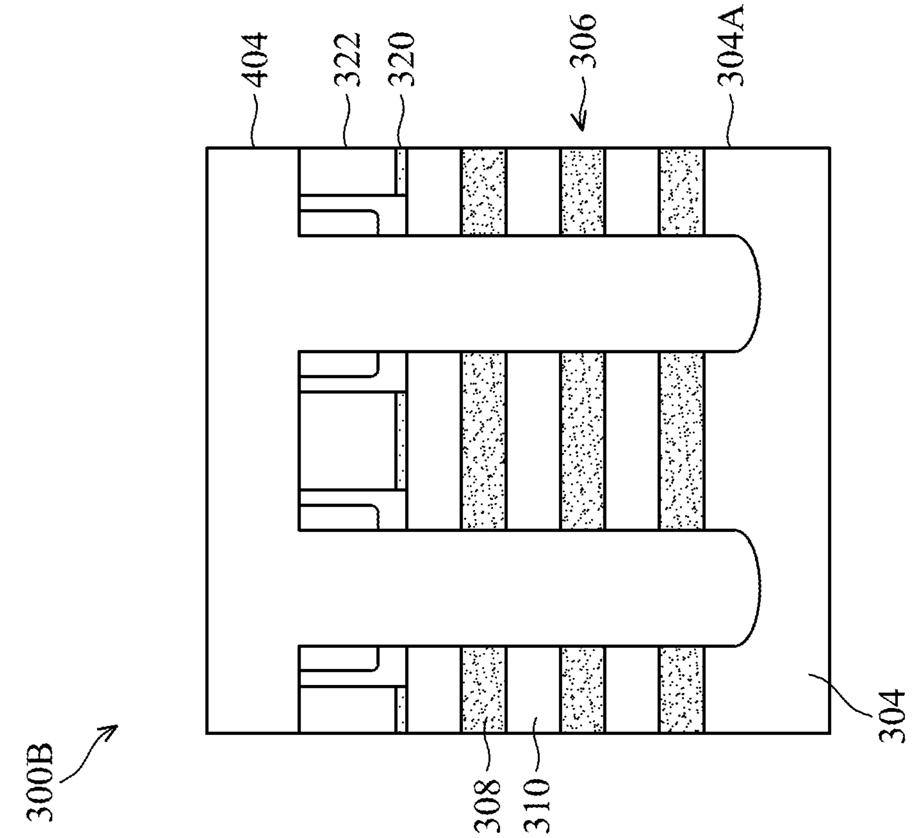
Figure 8A:
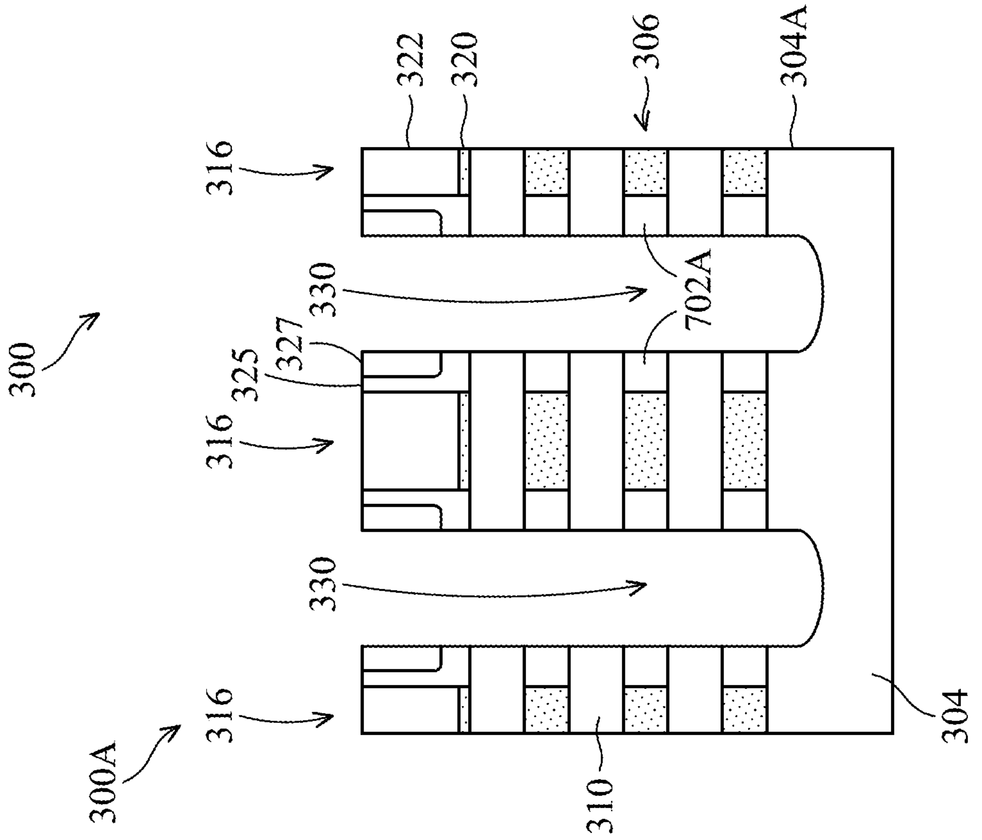
Figure 9B:
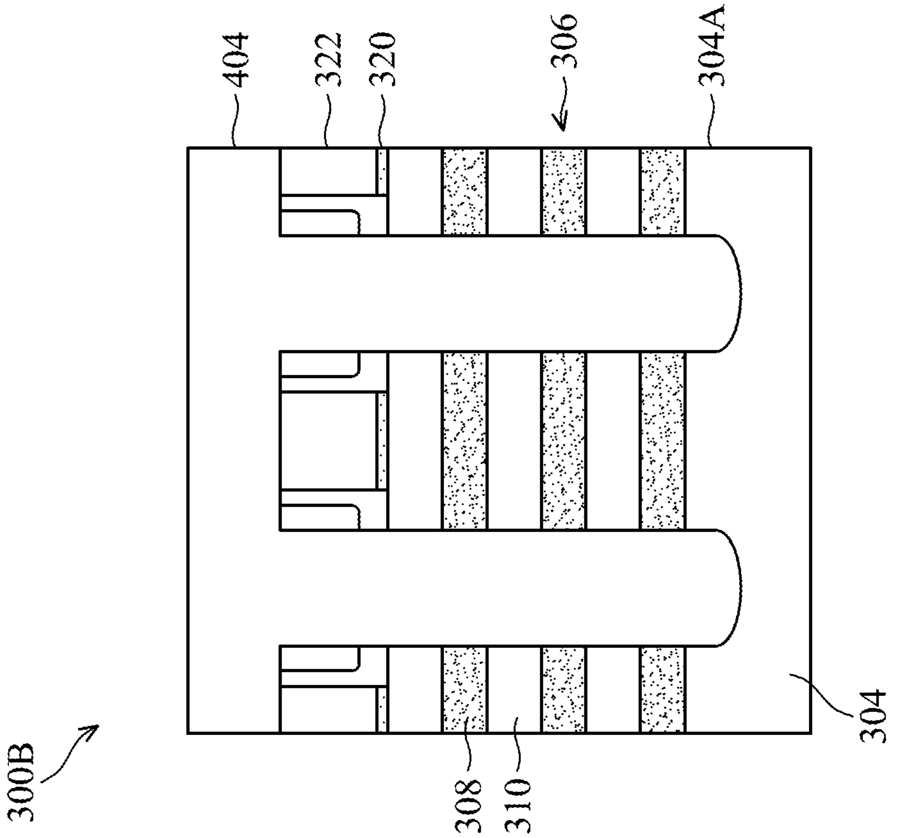
Figure 9A:
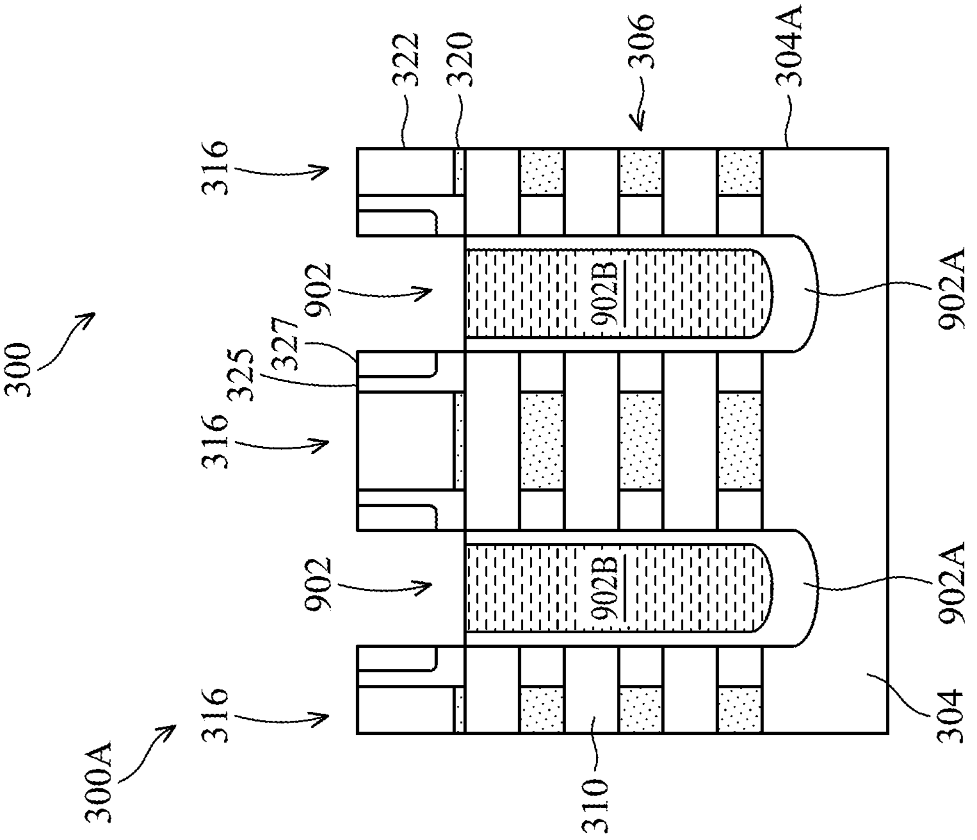

Referring to FIGS. 7A/7B and FIGS. 8A/8B, in a further embodiment of block 212, an inner spacer etch-back process is performed. In particular, and in some embodiments, the inner spacer etch-back process etches the inner spacer material 702 from over a top surface of the P-type device 300A and from over a top surface of the patterned resist layer 404 disposed on the N-type device 300B (the N-type device 300B being otherwise protected by the patterned resist layer 404). Further, the inner spacer etch-back process etches the inner spacer material 702 from along sidewalls of the trenches 330 of the P-type device 300A, while the inner spacer material remains disposed within the recesses 604, thereby providing inner spacers 702A for the P-type device 300A. The inner spacer etch-back process used to form the inner spacers 702A may include a wet etch process, a dry etch process, or a combination thereof. In some cases, any residual portions of the inner spacer material 702 that remain on top surfaces of the P-type device 300A and/or on sidewalls or bottom surfaces of the trenches 330 of the P-type device 300A, for example after the inner spacer etch-back process, may be removed during a subsequent clean process (e.g., prior to epitaxial growth of source/drain features). In various examples, the inner spacers 702A may extend beneath the one or more spacer layers 325, 327 formed on sidewalls of the gate stacks 316 of the P-type device 300A while being disposed adjacent to subsequently formed source/drain features, as described below. In some cases, the inner spacers 702A may extend at least partially beneath the gate stacks 316 of the P-type device 300A.

The method 200 then proceeds to block 214 where source/drain features are formed in the P-type device region. Referring to FIGS. 8A/8B and FIGS. 9A/9B, in an embodiment of block 214 and after formation of the inner spacers 702A, source/drain features 902 are formed in the source/drain regions adjacent to and on either side of the gate stacks 316 of the P-type device 300A. In an embodiment, the source/drain features 902 may include a first epitaxial layer 902A formed within the trenches 330 of the P-type device 300A, over the exposed portions of the substrate 304 and in contact with the adjacent inner spacers 702A and the semiconductor channel layers (the epitaxial layers 310) of the P-type device 300A. Further, the source/drain features 902 may include a second epitaxial layer 902B formed within the trenches 330 of the P-type device 300A and over the first epitaxial layer 902A. In some embodiments, a clean process may be performed immediately prior to formation of the source/drain features 902 to remove any residual portions of inner spacer material, as previously noted. The clean process may include a wet etch, a dry etch, or a combination thereof.

In some embodiments, the source/drain features 902, including the first epitaxial layer 902A and the second epitaxial layer 902B, are formed by epitaxially growing one or more semiconductor material layers in the source/drain regions. In general, the one or more semiconductor material layers grown to form the source/drain features 902 may include Ge, Si, GaAs, AlGaAs, SiGe, GaAsP, SiP, SiB, SiGeBx, SiAs, SiPAsx, SiC, SiCP, or other suitable material. Source/drain features 902 may be formed by one or more epitaxial (epi) processes, and in some cases, may be in-situ doped during the epi growth process. By way of example, and in some embodiments, P-type source/drain features (e.g., such as the source/drain features 902) formed within the P-type device region may include SiGe or a boron-doped epitaxial layer such as SiB or SiGeBx. In some embodiments, the source/drain features 902 are not in-situ doped, and instead an implantation process is performed to dope the source/drain features 902. In various examples, the first epitaxial layer 902A and the second epitaxial layer 902B may include different semiconductor material layers and/or different doping configurations of their respective semiconductor material layers. In at least some cases, the first epitaxial layer 902A and the second epitaxial layer 902B may include substantially similar (or the same) semiconductor material layers and/or substantially similar (or the same) doping configurations of their respective semiconductor material layers.

Figure 10B:
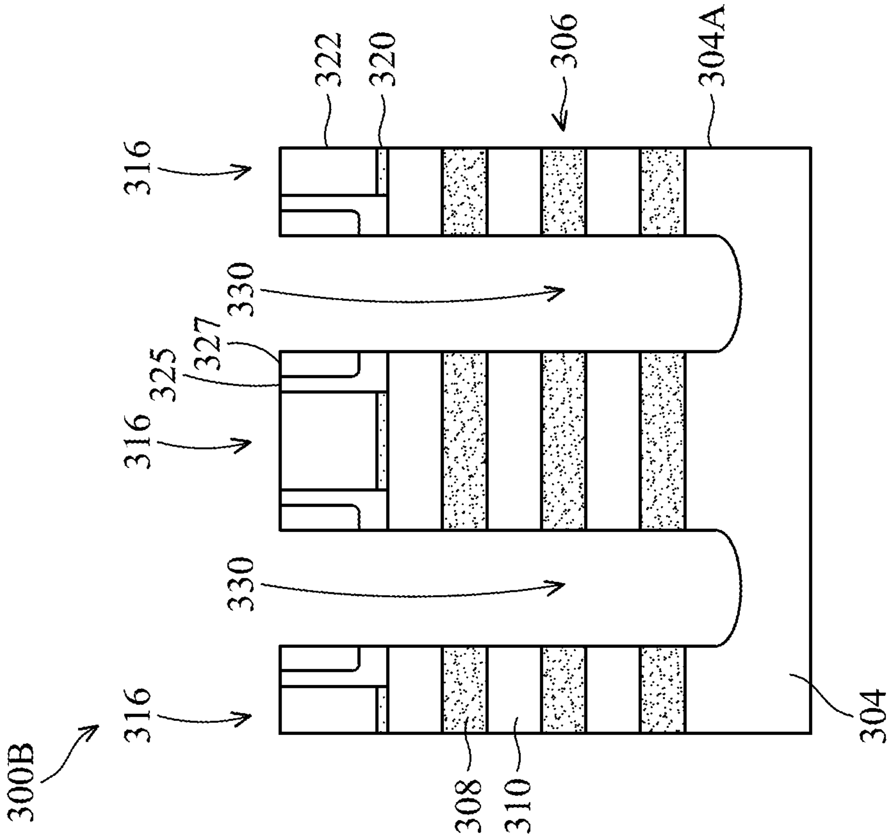

The method 200 then proceeds to block 216 where inner spacers are formed in the N-type device region. Initially, after forming the source/drain features 902 and with reference to FIGS. 9A/9B and FIGS. 10A/10B, the patterned resist layer 404 may be removed, for example, by way of a solvent, resist stripper, ashing, or other suitable technique. Thereafter, a patterned photoresist (resist) layer 1004 is formed over the P-type device region (including over the P-type device 300A), while the N-type device region (including the N-type device 300B) is exposed. As shown in FIG. 10B, exposure of the N-type device 300B exposes the trenches 330 in the N-type device region, which includes exposure of underlying portions of the substrate 304 and exposure of lateral surfaces of the epitaxial layers 308, 310. In an example, formation of the patterned resist layer 1004 may include forming a resist layer over the device 300 (including over each of the P-type device 300A and the N-type device 300B), exposing the resist to a pattern (e.g., as defined by a photomask), performing post-exposure bake processes, and developing the exposed resist to form the patterned resist layer 1004.

Figure 10A:
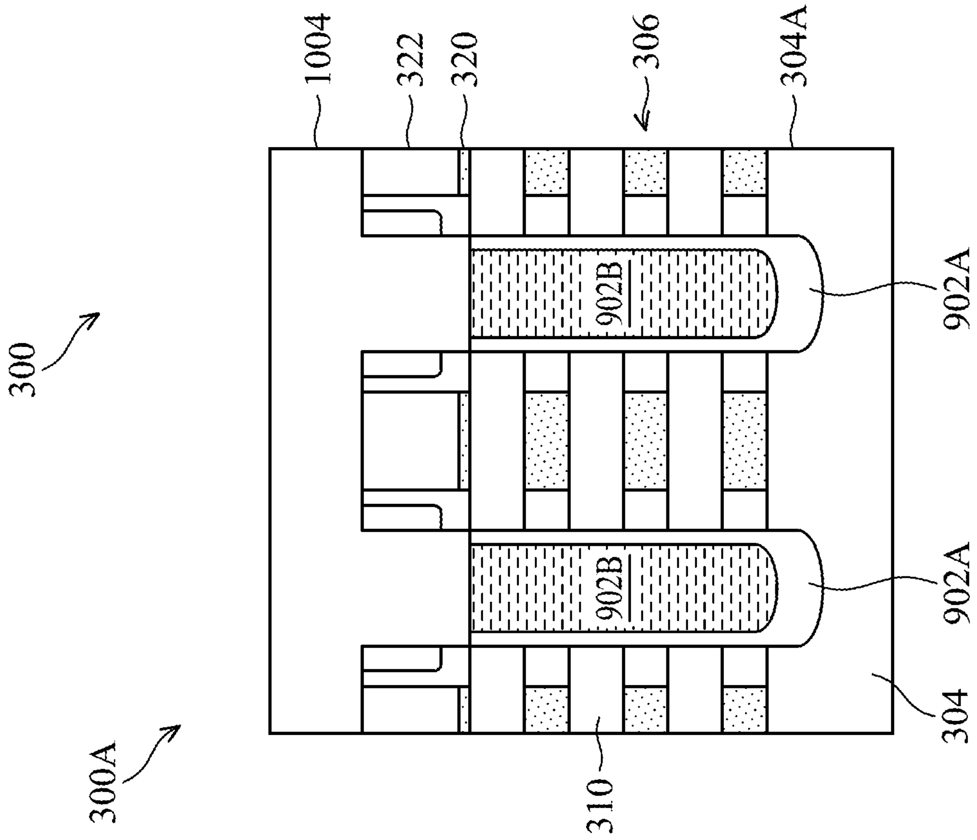
Figure 11B:
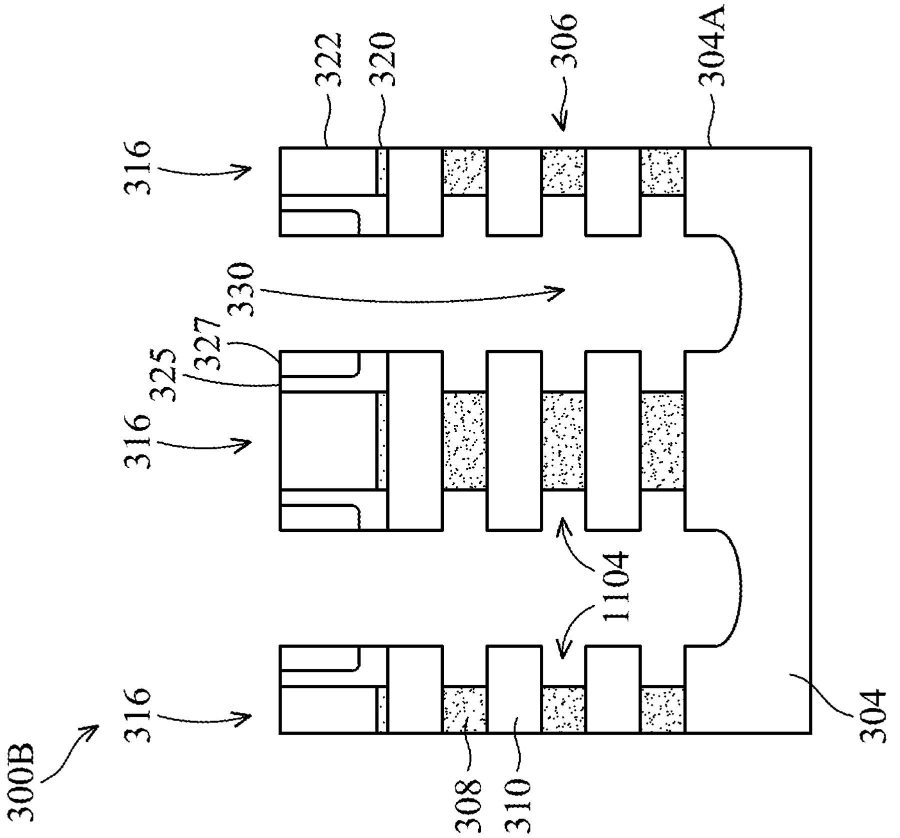
Figure 11A:
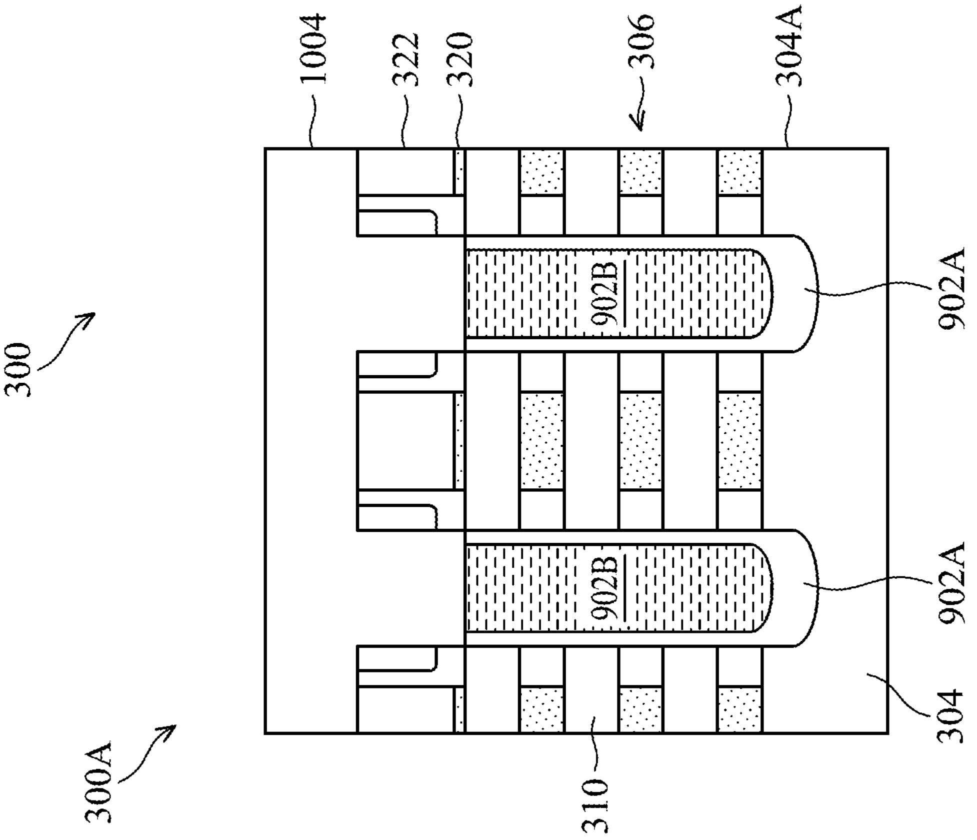

Referring to FIGS. 10A/10B and FIGS. 11A/11B, after forming the patterned resist layer 1004 and in an embodiment of block 216, a dummy layer recess process is performed to the N-type device 300B. The dummy layer recess process includes a lateral etch of the epitaxial layers 308 to form recesses 1104 along sidewalls of the trenches 330 of the N-type device 300B, while the epitaxial layers 308 remain at least partially disposed between adjacent semiconductor channel layers (the epitaxial layers 310) of the N-type device 300B. The portions of the epitaxial layers 308 that remain between the adjacent semiconductor channel layers will serve as SiGe interposers (epitaxial layers 308). During a later stage of processing, as discussed below, the SiGe interposers will be removed and replaced by a portions of a gate structure (e.g., a metal gate structure) that interface respective adjacent inner spacers. In some embodiments, the dummy layer recess process is performed using a dry etching process, a wet etching process, and/or a combination thereof. In some cases, the dummy layer recess process may include etching using a standard clean 1 (SC-1) solution, ozone ($O_3$), a solution of ammonium hydroxide ($NH_4OH$), hydrogen peroxide ($H_2O_2$) and water ($H_2O$), hydrofluoric acid (HF), buffered HF, and/or a fluorine ($F_2$)-based etch. In some examples, the $F_2$-based etch may include an $F_2$ remote plasma etch.

Figure 12B:
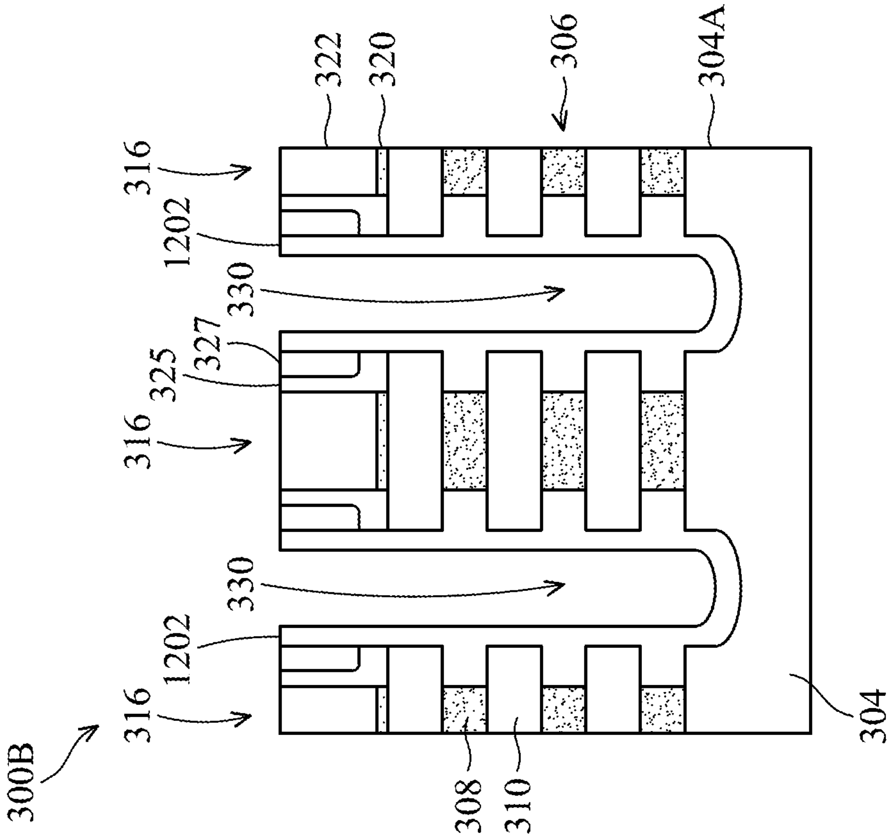
Figure 12A:
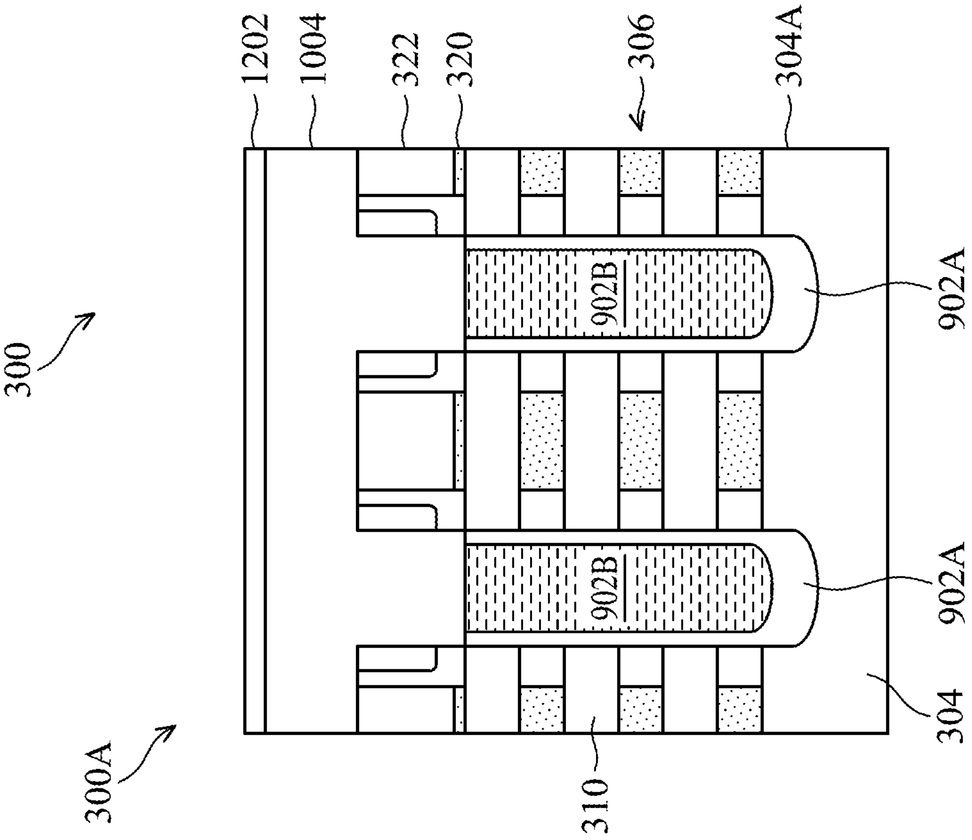

Referring to FIGS. 11A/11B and FIGS. 12A/12B, after the dummy layer recess process and in a further embodiment of block 216, an inner spacer material 1202 is conformally deposited over the device 300. In particular, the inner spacer material 1202 is conformally deposited within the trenches 330 of the N-type device 300B and within the recesses 1104 (e.g., formed by the dummy layer recess process, described above) of the N-type device 300B. The conformally deposited inner spacer material 1202 may substantially fill the recesses 1104, contacting lateral surfaces of the recessed epitaxial layers 308 (the SiGe interposers). In some embodiments, the inner spacer material 1202 may include amorphous silicon. In some examples, the inner spacer material 1202 may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. By way of example, the inner spacer material 1202 may be formed by conformally depositing the inner spacer material 1202 over the device 300 using processes such as a an ALD process, a CVD process, or other suitable process. As shown, and in some cases, the inner spacer material 1202 may also be deposited over the patterned resist layer 1004, which serves to mask and protect the P-type device 300A.

Figure 13B:
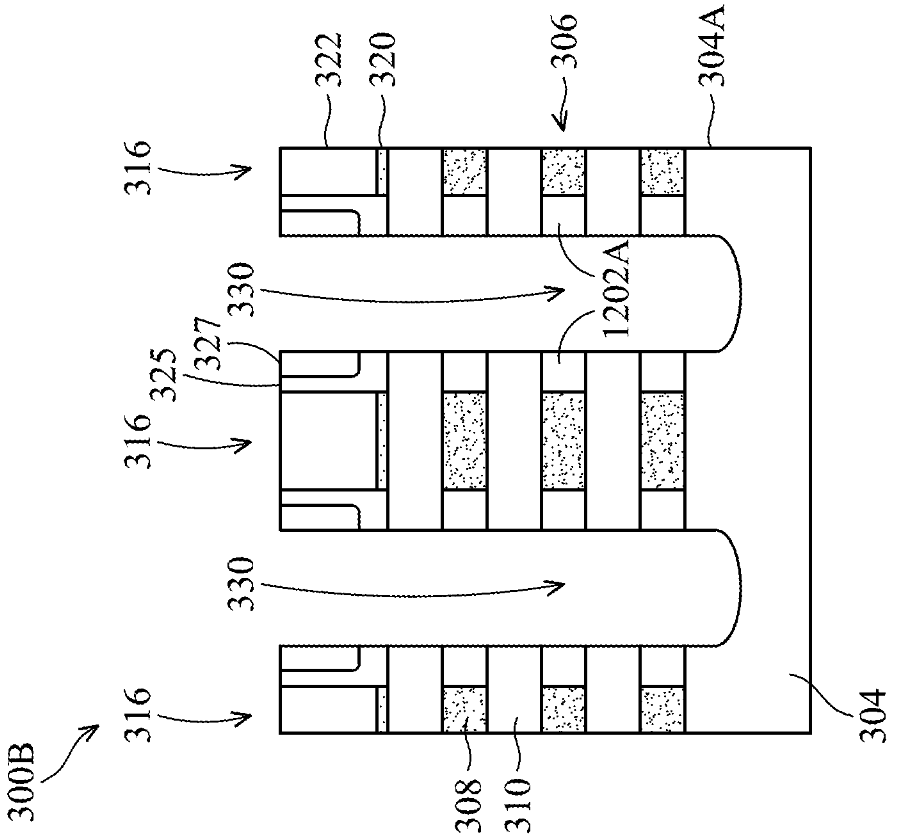
Figure 13A:
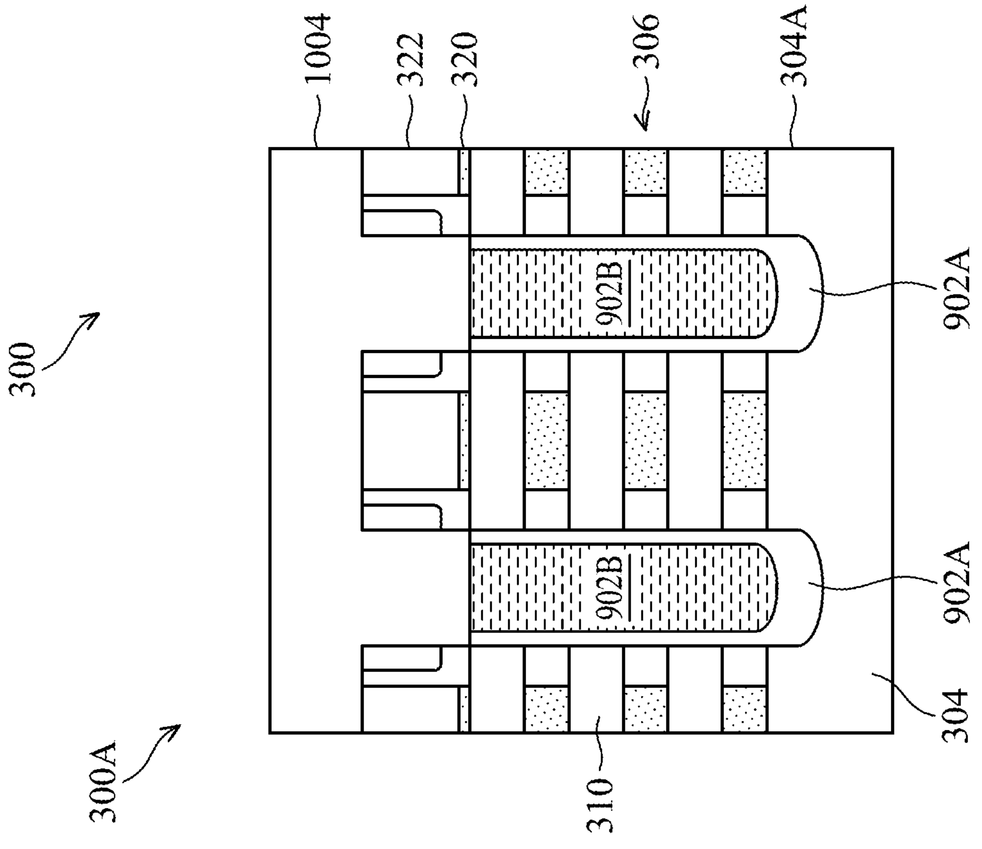
Figure 14B:
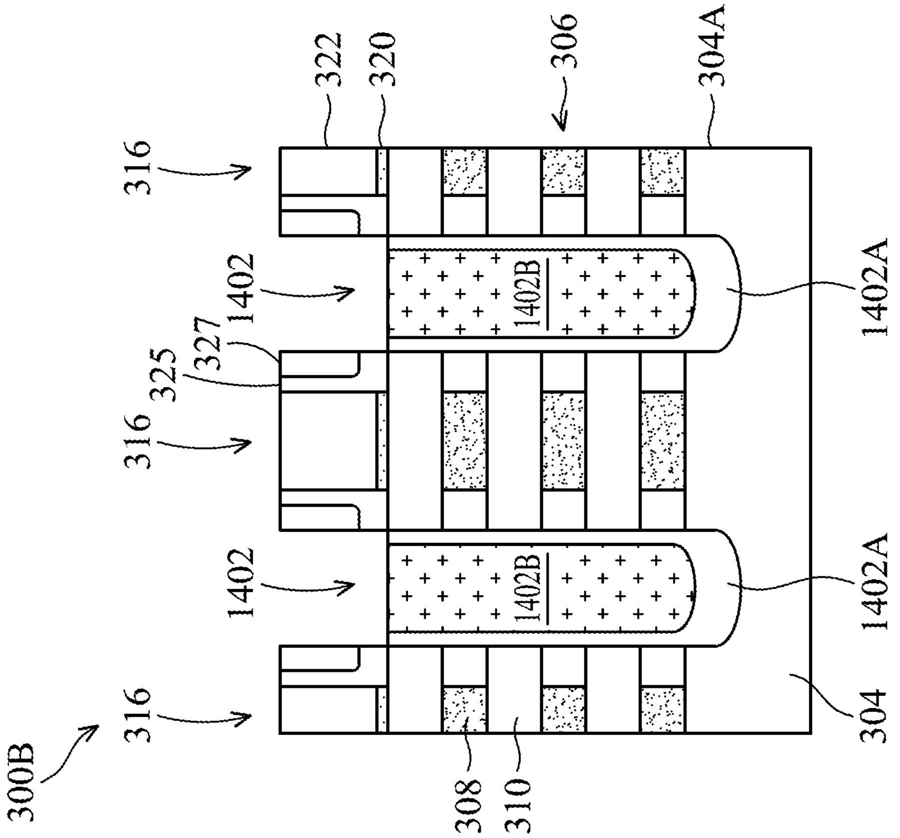
Figure 14A:
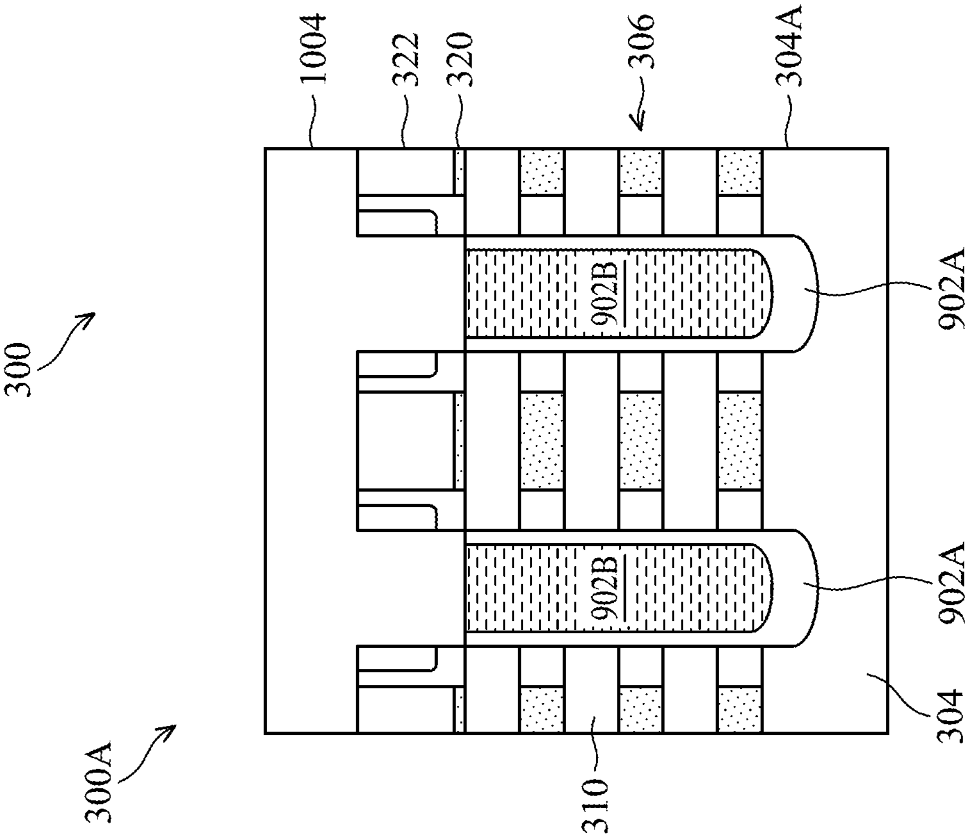

Referring to FIGS. 12A/12B and FIGS. 13A/13B, in a further embodiment of block 216, an inner spacer etch-back process is performed. In particular, and in some embodiments, the inner spacer etch-back process etches the inner spacer material 1202 from over a top surface of the N-type device 300B and from over a top surface of the patterned resist layer 1004 disposed on the P-type device 300A (the P-type device 300A being otherwise protected by the patterned resist layer 1004). Further, the inner spacer etch-back process etches the inner spacer material 1202 from along sidewalls of the trenches 330 of the N-type device 300B, while the inner spacer material remains disposed within the recesses 1104, thereby providing inner spacers 1202A for the N-type device 300B. The inner spacer etch-back process used to form the inner spacers 1202A may include a wet etch process, a dry etch process, or a combination thereof. In some cases, any residual portions of the inner spacer material 1202 that remain on top surfaces of the N-type device 300B and/or on sidewalls or bottom surfaces of the trenches 330 of the N-type device 300B, for example after the inner spacer etch-back process, may be removed during a subsequent clean process (e.g., prior to epitaxial growth of source/drain features). In various examples, the inner spacers 1202A may extend beneath the one or more spacer layers 325, 327 formed on sidewalls of the gate stacks 316 of the N-type device 300B while being disposed adjacent to subsequently formed source/drain features, as described below. In some cases, the inner spacers 1202A may extend at least partially beneath the gate stacks 316 of the N-type device 300B.

The method 200 then proceeds to block 218 where source/drain features are formed in the N-type device region. Referring to FIGS. 13A/13B and FIGS. 14A/14B, in an embodiment of block 218 and after formation of the inner spacers 1202A, source/drain features 1402 are formed in the source/drain regions adjacent to and on either side of the gate stacks 316 of the N-type device 300B. In an embodiment, the source/drain features 1402 may include a first epitaxial layer 1402A formed within the trenches 330 of the N-type device 300B, over the exposed portions of the substrate 304 and in contact with the adjacent inner spacers 1202A and the semiconductor channel layers (the epitaxial layers 310) of the N-type device 300B. Further, the source/drain features 1402 may include a second epitaxial layer 1402B formed within the trenches 330 of the N-type device 300B and over the first epitaxial layer 1402A. In some embodiments, a clean process may be performed immediately prior to formation of the source/drain features 1402 to remove any residual portions of inner spacer material, as previously noted. The clean process may include a wet etch, a dry etch, or a combination thereof.

In some embodiments, the source/drain features 1402, including the first epitaxial layer 1402A and the second epitaxial layer 1402B, are formed by epitaxially growing one or more semiconductor material layers in the source/drain regions. In general, the one or more semiconductor material layers grown to form the source/drain features 1402 may include Ge, Si, GaAs, AlGaAs, SiGe, GaAsP, SiP, SiB, SiGeBx, SiAs, SiPAsx, SiC, SiCP, or other suitable material. Source/drain features 1402 may be formed by one or more epitaxial (epi) processes, and in some cases, may be in-situ doped during the epi growth process. By way of example, and in some embodiments, N-type source/drain features (e.g., such as the source/drain features 1402) formed within the N-type device region may include SiP or an arsenic-doped epitaxial layer such as SiAs or SiPAsx. In some embodiments, the source/drain features 1402 are not in-situ doped, and instead an implantation process is performed to dope the source/drain features 1402. In various examples, the first epitaxial layer 1402A and the second epitaxial layer 1402B may include different semiconductor material layers and/or different doping configurations of their respective semiconductor material layers. In at least some cases, the first epitaxial layer 1402A and the second epitaxial layer 1402B may include substantially similar (or the same) semiconductor material layers and/or substantially similar (or the same) doping configurations of their respective semiconductor material layers. After forming the source/drain features 1402, and with reference to FIGS. 14A/14B and FIGS. 15A/15B, the patterned resist layer 1004 may be removed, for example, by way of a solvent, resist stripper, ashing, or other suitable technique.

Figure 15B:
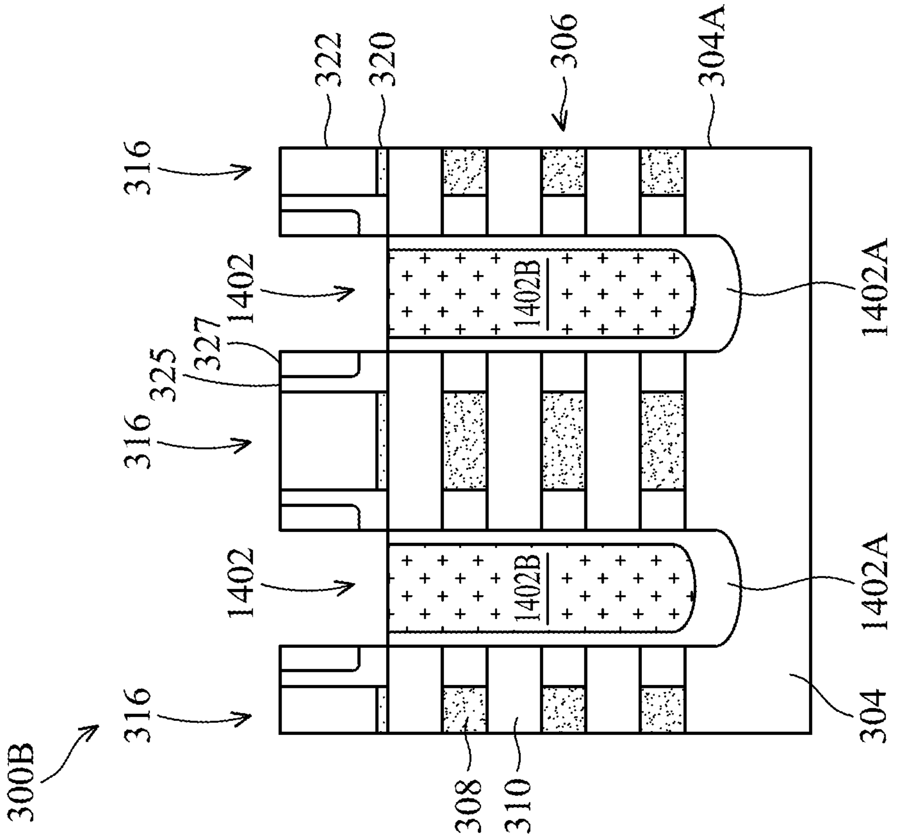
Figure 15A:
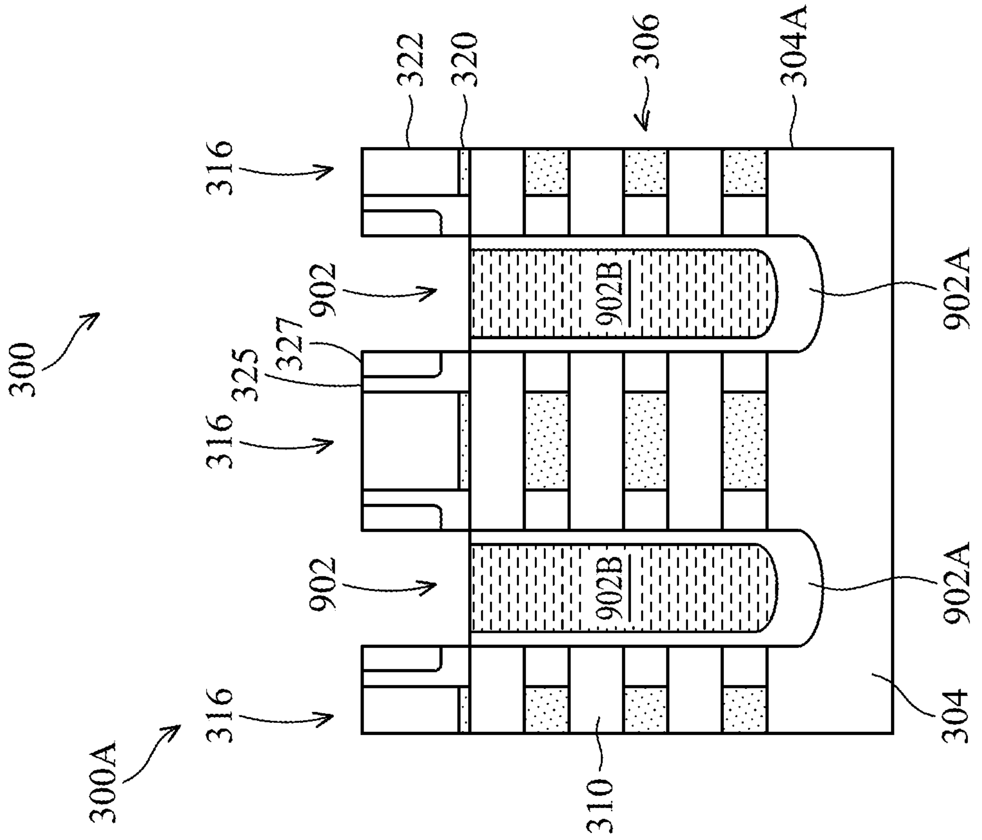
Figure 16B:
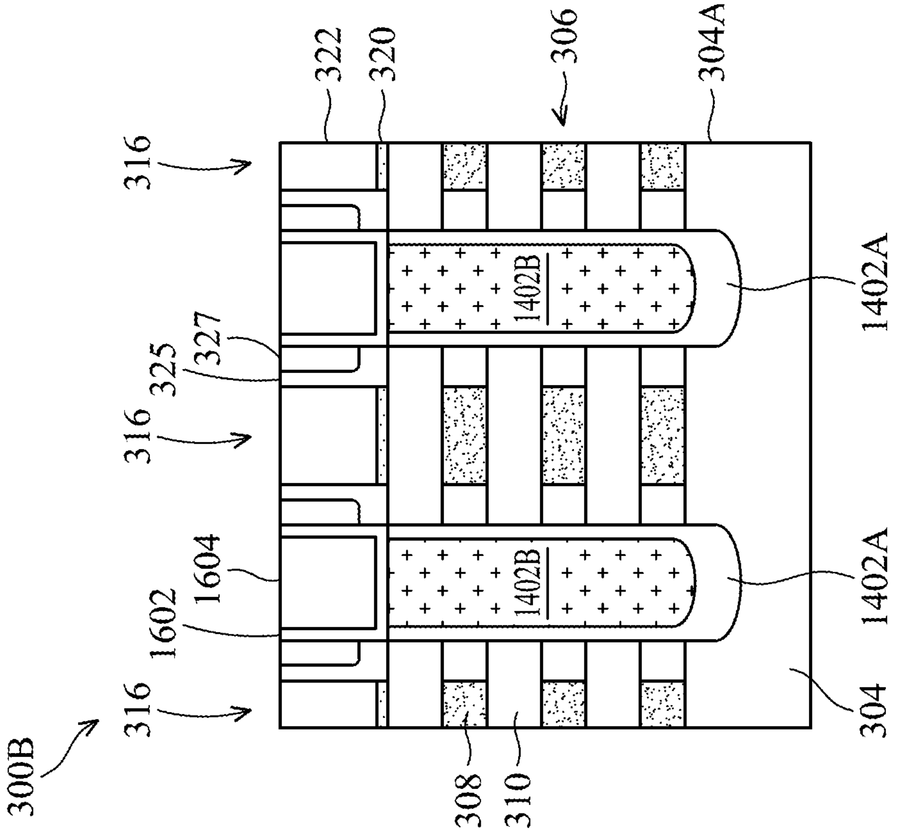
Figure 16A:
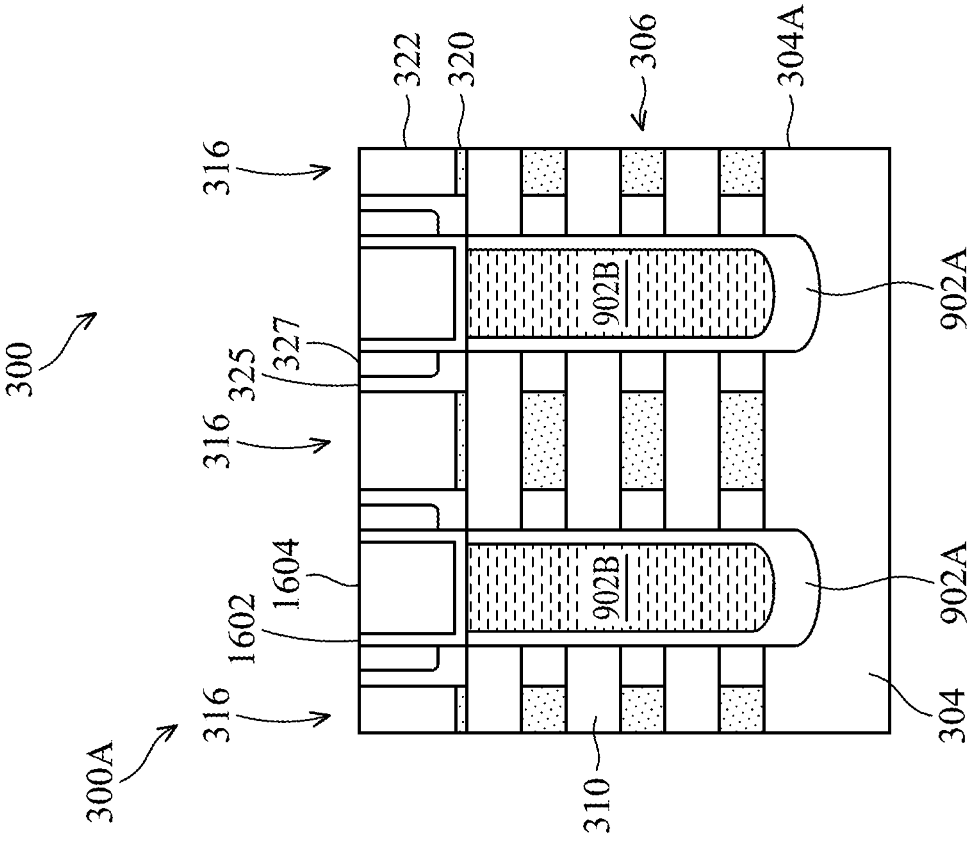
Figure 17A:
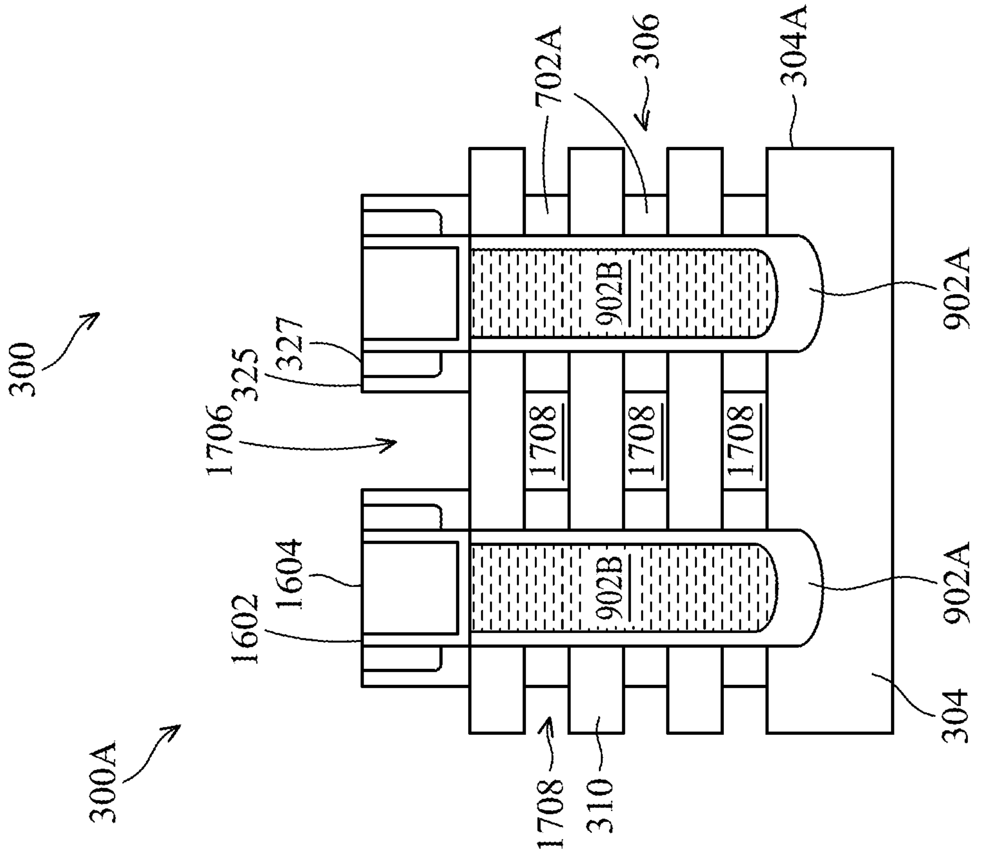
Figure 17B:
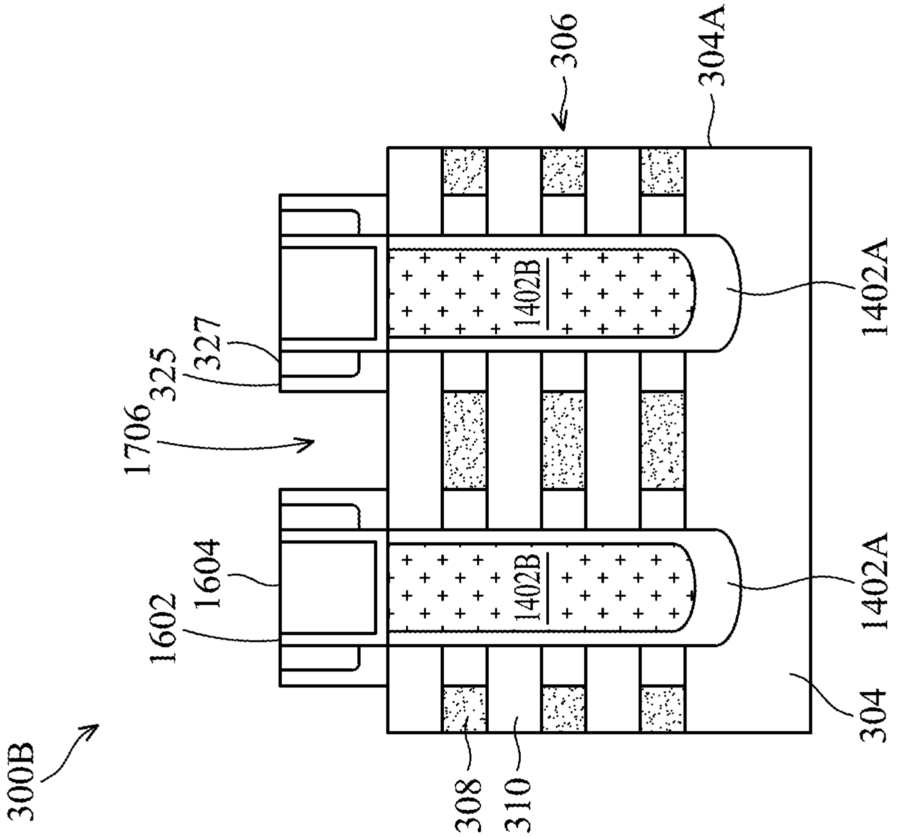
Figure 18B:
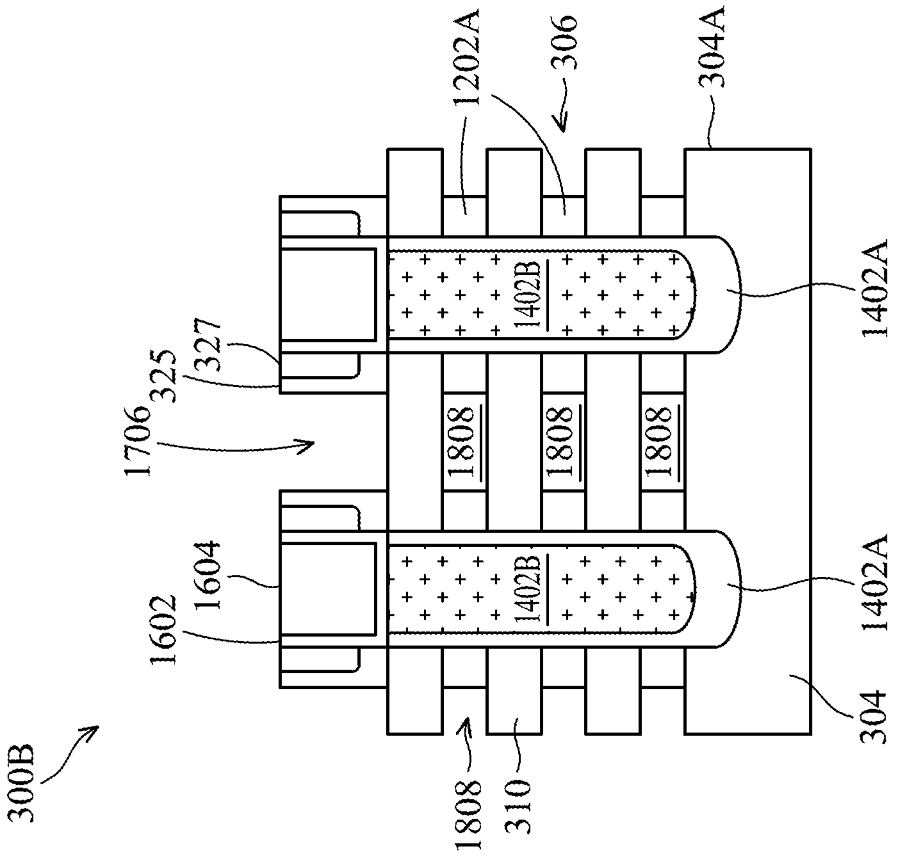
Figure 18A:
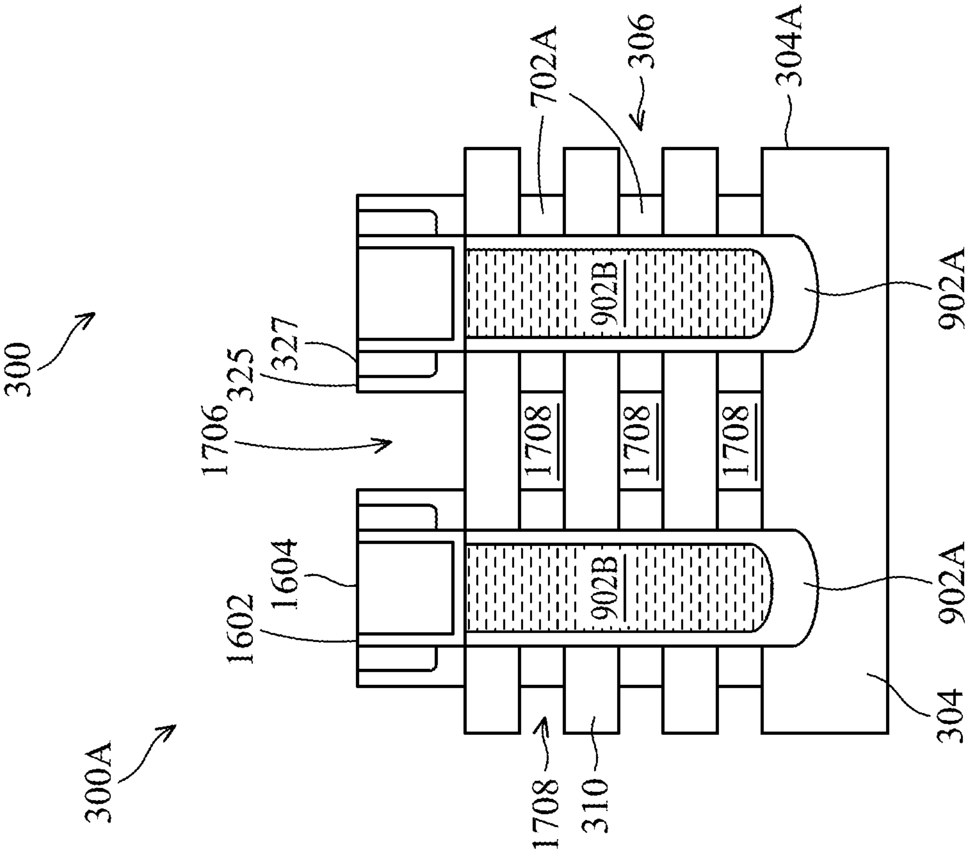

The method 200 then proceeds to block 220 where a contact etch stop layer (CESL) and an inter-layer dielectric (ILD) layer are formed. Referring to FIGS. 15A/15B and FIGS. 16A/16B, after forming the source/drain features 1402 and removing the patterned resist layer 1004, and in an embodiment of block 220, a CESL 1602 may be conformally formed over the device 300, including over the P-type device 300A and the N-type device 300B. In particular, the CESL 1602 may be formed in openings disposed over each of the source/drain features 902 and the source/drain features 1402 and between adjacent gate stacks 316 of respective ones of the P-type device 300A and the N-type device 300B. In some examples, the CESL 1602 may include a silicon nitride layer, silicon oxide layer, a silicon oxynitride layer, and/or other materials known in the art. In some embodiments, and in a further embodiment of block 220, an ILD layer 1604 may be formed over the CESL 1602 for each of the P-type device 300A and the N-type device 300B. In various cases, the ILD layer 1604 may include materials such as tetraethylorthosilicate (TEOS) oxide, un-doped silicate glass, or doped silicon oxide such as borophosphosilicate glass (BPSG), fluorosilicate glass (FSG), phosphosilicate glass (PSG), boron doped silicon glass (BSG), and/or other suitable dielectric materials. In some embodiments, after formation of the ILD layer 1604, the device 300 may be subject to a high thermal budget process to anneal the ILD layer 1604. In some embodiments, after formation of the CESL 1602 and the ILD layer 1604, a chemical mechanical polishing (CMP) process may be performed to remove portions of the ILD layer 1604 and the CESL 1602 overlying the gate stacks 316, as well as any hard mask layers that may be present over the gate stacks 316, to planarize a top surface of the device 300 and expose a top surface of the electrode layer 322 of the gate stacks 316 of each of the P-type device 300A and the N-type device 300B.

The method 200 then proceeds to block 222 where dummy gate stacks (the gate stacks 316) are removed from the P-type and N-type device regions, and the disposable interposer is removed from the P-type device region. Referring to the example of FIGS. 16A/16B and FIGS. 17A/17B, in an embodiment of block 222, the electrode layer 322 of the gate stacks 316 (e.g., exposed by the CMP process, as noted above) of each of the P-type device 300A and the N-type device 300B may be removed by suitable etching processes to form trenches 1706 that expose the dielectric layer 320 of the gate stacks 316 of each of the P-type device 300A and the N-type device 300B. In some examples, the etching processes used to remove the electrode layer 322 may include a wet etch, a dry etch, or a combination thereof. Thereafter, in some embodiments, an etching process may be performed to remove the exposed dielectric layer 320 from the trenches 1706 of each of the P-type device 300A and the N-type device 300B. In some examples, the etching processes used to remove the dielectric layer 320 may include a wet etch, a dry etch, or a combination thereof. In some examples, removal of the dielectric layer 320 may be performed using a vapor dilute hydrofluoric (dHF) acid etch performed using a CERTAS® Gas Chemical Etch System, available from Tokyo Electron Limited, Tokyo, Japan. In some embodiments, removal of the dielectric layer 320 may be performed using a wet etch process such as a phosphoric acid ($H_3PO_4$) chemical etch of the dielectric layer 320. In some alternative examples, cycles of a high temperature sulfuric peroxide mixture (HTSPM) and dilute hydrofluoric acid (dHF), ozone ($O_3$) and dHF, or a combination thereof, may be used to perform the removal of the dielectric layer 320.

It is noted that since the dielectric layer 320 and the portions of the dielectric layer 502 that remain disposed between adjacent semiconductor channel layers (the disposable interposers) in the channel region of the P-type device 300A may be composed of the same or similar materials (e.g., both the dielectric layer 320 and the disposable interposers may include an oxide layer, a nitride layer, or other similar dielectric layer), the process performed to remove the dielectric layer 320 may additionally selectively remove the disposable interposers at the same time (e.g., during the same etching process) while the semiconductor channel layers (the epitaxial layers 310) and the inner spacers 702A remain substantially unetched. However, the SiGe interposers of the N-type device 300B (e.g., including portions of the epitaxial layers 308 that remain between the adjacent semiconductor channel layers) may remain unetched by the process performed to remove the dielectric layer 320. It is further noted that removal of the electrode layer 322 and the dielectric layer 320 provides for removal of the dummy gates (gate stacks 316), for example, as part of a replacement gate process. Thus, as merely one example, if both the dielectric layer 320 and the disposable interposers of the P-type device 300A include an oxide layer (or nitride layer, or other similar dielectric layer), the disposable interposers will be removed together with the dielectric layer 320 as part of the replacement gate process.

As a result of the selective removal of the remaining portions of the dielectric layer 502 (the disposable interposers), gaps 1708 are formed between the adjacent semiconductor channel layers (the epitaxial layers 310) in the channel region of the P-type device 300A. By way of example, the gaps 1708 serve to expose first portions of the epitaxial layers 310 between opposing inner spacers 702A, while second portions of the epitaxial layers 310 remain covered by the inner spacers 702A. As described in more detail below, portions of gate structures (e.g., including a metal gate stack having an interfacial layer, a high-K dielectric layer, and one or more metal electrode layers) will be formed within the gaps 1708 between adjacent semiconductor channel layers (the epitaxial layers 310) and in contact with the inner spacers 702A.

The method 200 then proceeds to block 224 where the SiGe interposer is removed from the N-type device region. Referring to the example of FIGS. 17A/17B and FIGS. 18A/18B, in an embodiment of block 224, the SiGe interposers (portions of the epitaxial layers 308 that remain between the adjacent semiconductor channel layers, which may also be referred to as dummy layers) in the channel region of the N-type device 300B may be selectively removed (e.g., using a selective etching process). The selective etching of the SiGe interposers may be performed through a trench provided by the removal of the dummy gates (gate stacks 316). In some embodiments, the selective etching process may include a selective wet etching process. In some cases, the selective wet etching process includes tetra-methyl ammonium hydroxide (TMAH). In some embodiments, the selective etching process may include a dry, plasma-free etching process performed using a CERTAS® Gas Chemical Etch System, available from Tokyo Electron Limited, Tokyo, Japan. In some examples, the selective etching process may include etching using a standard clean 1 (SC-1) solution, a solution of ammonium hydroxide ($NH_4OH$), hydrogen peroxide ($H_2O_2$) and water ($H_2O$), hydrofluoric acid (HF), buffered HF, and/or a fluorine ($F_2$)-based etch. In some examples, the $F_2$-based etch may include an $F_2$ remote plasma etch.

It is noted that as a result of the selective removal of the SiGe interposers, gaps 1808 are formed between the adjacent semiconductor channel layers (the epitaxial layers 310) in the channel region of the N-type device 300B. By way of example, the gaps 1808 serve to expose first portions of the epitaxial layers 310 between opposing inner spacers 1202A, while second portions of the epitaxial layers 310 remain covered by the inner spacers 1202A. As described in more detail below, portions of gate structures (e.g., including a metal gate stack having an interfacial layer, a high-K dielectric layer, and one or more metal electrode layers) will be formed within the gaps 1808 between adjacent semiconductor channel layers (the epitaxial layers 310) and in contact with the inner spacers 1202A.

In some cases, dopant diffusion (e.g., such as diffusion of Ge) from the SiGe interposers may form a SiGe/Si intermix layer at an interface between the SiGe interposers and the semiconductor channel layers (the epitaxial layers 310) in the channel region of the N-type device 300B. As a result, removal of the SiGe interposers may also at least partially etch top and/or bottom surfaces of the epitaxial layers 310 (semiconductor channel layers) within the channel region of the N-type device 300B (e.g., including at least portions of the SiGe/Si intermix layer), such that the semiconductor channel layers (epitaxial layers 310) are slightly thinner in the channel region as compared to an LDD region, thereby forming a dog-bone structure of the epitaxial layers 310 in the N-type device 300B. In contrast, the semiconductor channel layers (epitaxial layers 310) of the P-type device 300A (in which the SiGe interposers were replaced with disposable interposers as describe herein), may remain substantially rectangular shaped. To be sure, in some examples, top and/or bottom surfaces of the epitaxial layers 310 (semiconductor channel layers) within the channel region of the P-type device 300A might be very slightly etched (at block 206 and/or block 222). However, even in such cases, any consumption of the top and/or bottom surfaces of the epitaxial layers 310 of the P-type device 300A will be less than consumption of the top and/or bottom surfaces of the epitaxial layers 310 of the N-type device 300B (e.g., due to the SiGe/Si intermix layer in the N-type device 300B). Addition, in some embodiments (and due to the use of disposable interposers or SiGe interposers), the inner spacers 702A, 1202A of each of the P-type device 300A and the N-type device 300B may likewise have different shapes.

The method 200 then proceeds to block 226 where final gate structures are formed in the P-type and N-type device regions. Referring to the example of FIGS. 18A/18B and FIGS. 19A/19B, in an embodiment of block 226, final gate structures 1916 for each of the P-type device 300A and the N-type device 300B are formed. The gate structures 1916 may include a high-K/metal gate stack, however other compositions are possible. In some embodiments, the gate structures 1916 may form the gate associated with the multi-channels provided by the plurality of exposed semiconductor channel layers (the exposed epitaxial layers 310, previously having gaps 1708 or gaps 1808 therebetween) in the channel regions of the P-type device 300A and the N-type device 300B. In some embodiments, the gate structures 1916 include a dielectric layer 1902 formed on exposed surfaces of the epitaxial layers 310 (semiconductor channel layers), including on the exposed first portions of the epitaxial layers 310 within the gaps 1708 between opposing surfaces of the inner spacers 702A (as well as on surfaces of the inner spacers 702A themselves), and on the exposed first portions of the epitaxial layers 310 within the gaps 1808 between opposing surfaces of the inner spacers 1202A (as well as on surfaces of the inner spacers 1202A themselves).

In some embodiments, the dielectric layer 1902 includes an interfacial layer (IL) and a high-K dielectric layer formed over the IL. In various embodiments, the IL and the high-K dielectric layer collectively define a gate dielectric of the gate structure for the P-type device 300A and the N-type device 300B. In some embodiments, the gate dielectric has a total thickness of about 1-5 nm. High-K gate dielectrics, as used and described herein, include dielectric materials having a high dielectric constant, for example, greater than that of thermal silicon oxide (~3.9).

In some embodiments, the IL may include a dielectric material such as silicon oxide ($SiO_2$), HfSiO, or silicon oxynitride (SiON). In some examples, the high-K dielectric layer may include hafnium oxide ($HfO_2$). Alternatively, the high-K dielectric layer may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), combinations thereof, or other suitable material. In various embodiments, the gate dielectric may be formed by thermal oxidation, ALD, physical vapor deposition (PVD), pulsed laser deposition (PLD), CVD, and/or other suitable methods.

Figure 19B:
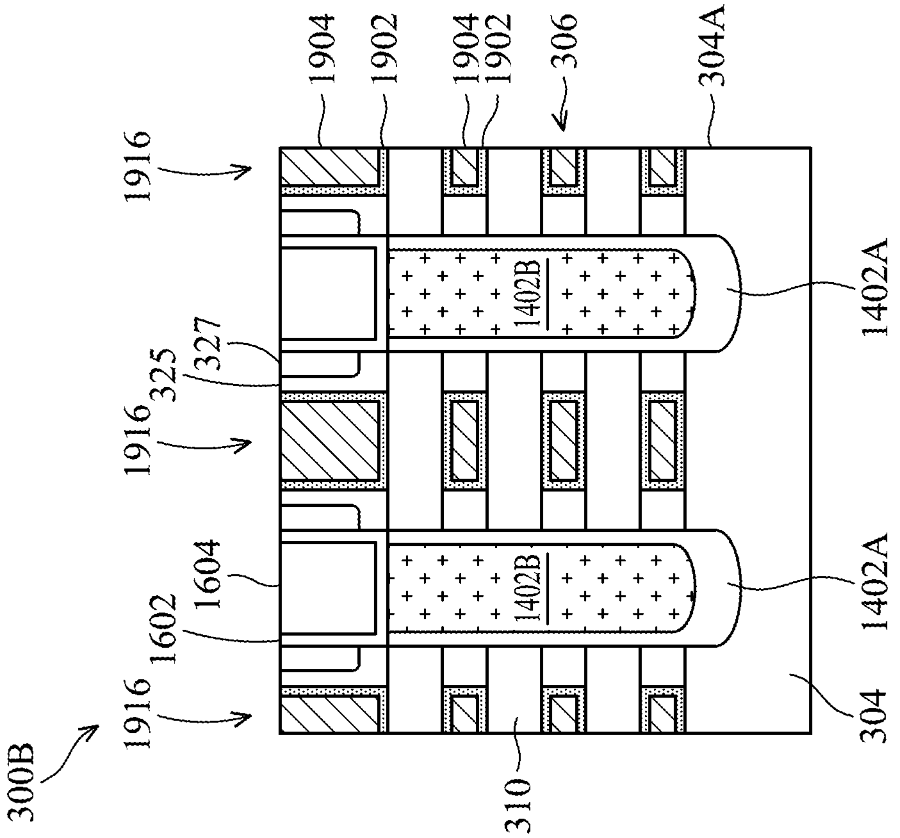
Figure 19A:
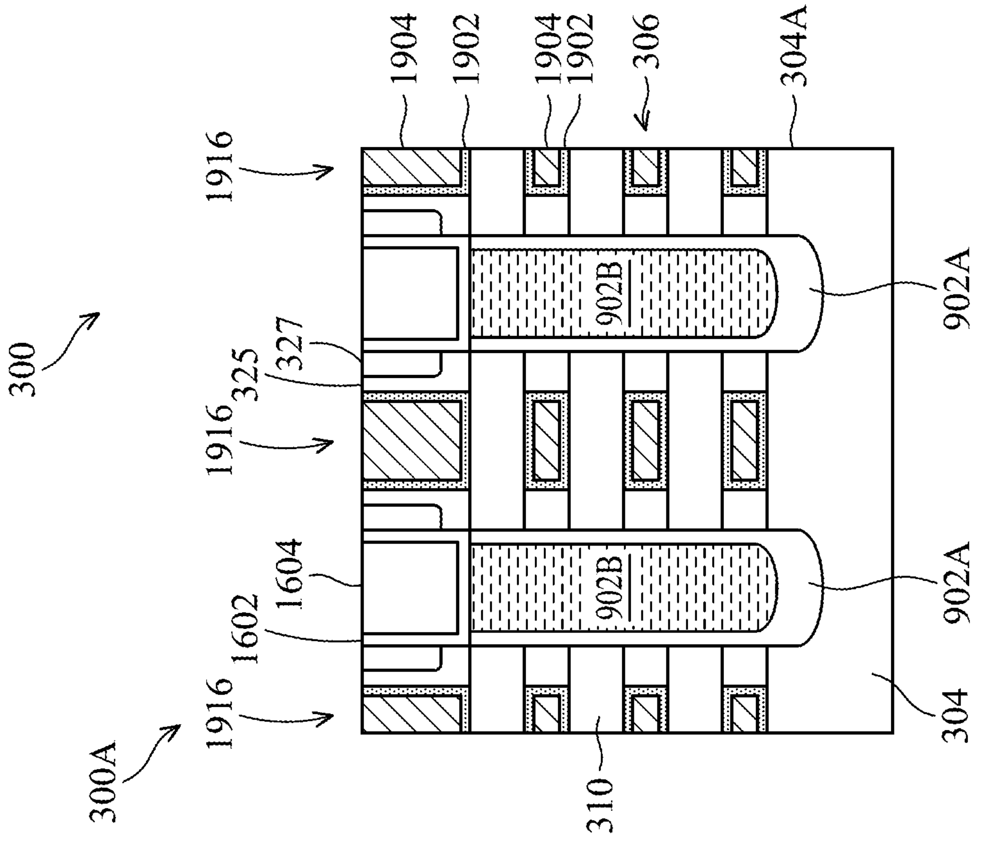

Still referring to the examples of FIGS. 19A/19B, a metal gate including a metal layer 1904 is formed over the gate dielectric (e.g., over the IL and the high-K dielectric layer). The metal layer 1904 may include a metal, metal alloy, or metal silicide. Additionally, the formation of the gate dielectric/metal gate stack may include depositions to form various gate materials, one or more liner layers, and one or more CMP processes to remove excessive gate materials and thereby planarize a top surface of the device 300, including the P-type device 300A and the N-type device 300B.

In some embodiments, the metal layer 1904 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer 1904 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer 1904 may be formed by ALD, PVD, CVD, e-beam evaporation, or other suitable process. Further, the metal layer 1904 may be formed separately for each of the P-type device 300A and the N-type device 300B which may use different metal layers. In addition, the metal layer 1904 may provide an N-type or P-type work function for each of the P-type device 300A and the N-type device 300B, may serve as a transistor (e.g., GAA transistor) gate electrode, and in at least some embodiments, the metal layer 1904 may include a polysilicon layer. With respect to the devices shown and discussed, the gate structures 1916 include portions that interpose each of the epitaxial layers 310, which each provide semiconductor channel layers for each of the P-type device 300A and the N-type device 300B.

Generally, the semiconductor device 300, including the P-type device 300A and the N-type device 300B, may undergo further processing to form various features and regions known in the art. For example, further processing may form various contacts/vias/lines and multilayer interconnect features (e.g., metal layers and interlayer dielectrics) on the substrate 304, configured to connect the various features to form a functional circuit that may include one or more multi-gate devices (e.g., one or more GAA transistors) such as the P-type device 300A and the N-type device 300B. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be modified, replaced, or eliminated in accordance with various embodiments of the method 200.

With respect to the description provided herein, disclosed are methods and structures for replacing SiGe interposers with a disposable interposer between semiconductor channel layers of GAA transistors (e.g., in particular P-type GAA transistors). In some embodiments, a method of inserting a disposable interposer between semiconductor channel layers of GAA transistors includes initially removing SiGe layers that interpose adjacent semiconductor channel layers (e.g., such as by a wet etching process) and re-depositing an oxide or other dielectric material layer to conformally fill the cavity formed by removal of the SiGe layers. Thereafter, a recessing process is performed to recess the deposited oxide or other dielectric material layer to form an inner spacer recess between lateral ends of adjacent semiconductor channel layers. Afterwards, an inner spacer material is deposited and etched-back (e.g., using a dry etching process) to complete formation of the inner spacer. After formation of the inner spacer, epitaxial source/drain features are formed, and the remaining oxide or other dielectric material layer (e.g., the disposable interposer) is removed to form gaps between adjacent semiconductor channel layers within which a metal gate structure is subsequently formed.

By replacing SiGe interposers with disposable interposers (e.g., such as an oxide or other dielectric material), embodiments of the GAA transistors disclosed herein prevent formation of a SiGe/Si intermix layer (e.g., by removal of Ge diffusion source), reduce interface traps (e.g., by avoiding formation of Ge residue at corners between the gate structure, Si channel layers, and inner spacers), provide higher mobility and drive current, reduce fringing capacitance (e.g., by minimizing formation of a dog-bone structure of the Si channel layers), provide enhanced control of short-channel effects (SCEs), and provide enhanced compressive stress in the Si channel layers (e.g., for P-type GAA transistors), thereby improving device performance. For N-type GAA transistors, in some embodiments, SiGe interposers may continue to be used to provide enhanced tensile stress in the Si channel layers. Other embodiments and advantages will be evident to those skilled in the art upon reading the present disclosure.

Thus, one of the embodiments of the present disclosure described a method that includes providing a first fin in a first type device region and a second fin in a second type device region. In some embodiments, the first fin includes a first epitaxial layer stack having a first plurality of semiconductor channel layers interposed by a first plurality of dummy layers, and the second fin includes a second epitaxial layer stack having a second plurality of semiconductor channel layers interposed by a second plurality of dummy layers. In some examples, the method further includes masking the second fin. In some embodiments, and while the second fin is masked, the method further includes removing the first plurality of dummy layers from the first type device region to form a first gap between adjacent semiconductor channel layers of the first plurality of semiconductor channel layers. In some examples, while the second fin remains masked, the method further includes forming a dielectric layer in a first channel region within the first gap between the adjacent semiconductor channel layers of the first plurality of semiconductor channel layers. In some cases, while the second fin remains masked, the method further includes forming first inner spacers within the first gap between the adjacent semiconductor channel layers of the first plurality of semiconductor channel layers and on opposing sides of the dielectric layer.

In another of the embodiments, discussed is a method that includes providing a first fin structure having epitaxial layers of a first composition interposed by epitaxial layers of a second composition and a second fin structure having epitaxial layers of the first composition interposed by epitaxial layers of the second composition. In some embodiments, the method further includes forming a first dummy gate over the first fin structure and a first spacer layer on sidewalls of the first dummy gate, and a second dummy gate over the second fin structure and a second spacer layer on sidewalls of the second dummy gate. In some examples, the method further includes replacing, within the first fin structure, the epitaxial layers of the second composition with disposable interposers disposed beneath the first dummy gate and first inner spacers on opposing ends of the disposable interposers and beneath the first spacer layer. In some embodiments, the method further includes etching back, within the second fin structure, opposing lateral ends of the epitaxial layers of the second composition to form recesses disposed beneath the second spacer layer and between adjacent epitaxial layers of the first composition. In some cases, the method further includes forming second inner spacers, within the second fin structure, within each of the recesses on the opposing lateral ends of the epitaxial layers of the second composition.

In yet another of the embodiments, discussed is a semiconductor device including a first fin extending from a substrate in a P-type device region and a second fin extending from the substrate in an N-type device region. In some embodiments, the first fin includes a first plurality of semiconductor channel layers, and the second fin includes a second plurality of semiconductor channel layers. In some examples, the semiconductor device further includes first inner spacers disposed between adjacent semiconductor channel layers of the first plurality of semiconductor channel layers and on either side of a first channel region. In some cases, the semiconductor device further includes second inner spacers disposed between adjacent semiconductor channel layers of the second plurality of semiconductor channel layers and on either side of a second channel region. In some embodiments, each of the first plurality of semiconductor channel layers has a substantially rectangular shape, and each of the second plurality of semiconductor channel layers has a dog-bone structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:

providing a first fin in a first type device region and a second fin in a second type device region, the first fin including a first epitaxial layer stack having a first plurality of semiconductor channel layers interposed by a first plurality of dummy layers, and the second fin including a second epitaxial layer stack having a second plurality of semiconductor channel layers interposed by a second plurality of dummy layers; and masking the second fin, wherein while the second fin is masked the method further comprises:

removing the first plurality of dummy layers from the first type device region to form a first gap between adjacent semiconductor channel layers of the first plurality of semiconductor channel layers;

forming a dielectric layer in a first channel region within the first gap between the adjacent semiconductor channel layers of the first plurality of semiconductor channel layers; and forming first inner spacers within the first gap between the adjacent semiconductor channel layers of the first plurality of semiconductor channel layers and on opposing sides of the dielectric layer.

2. The method of claim 1, further comprising:

prior to masking the second fin, removing portions of the first epitaxial layer stack in first source/drain regions of the first fin to expose lateral surfaces of the first plurality of semiconductor channel layers and the first plurality of dummy layers, and removing portions of the second epitaxial layer stack in second source/drain regions of the second fin to expose lateral surfaces of the second plurality of semiconductor channel layers and the second plurality of dummy layers.

3. The method of claim 1, wherein the dielectric layer includes an oxide layer or a nitride layer.

4. The method of claim 1, wherein the dielectric layer provides a disposable interposer.

5. The method of claim 1, wherein the forming the dielectric layer in the first channel region comprises:

conformally depositing the dielectric layer within the first gap, the dielectric layer substantially filling the first gap; and recessing the dielectric layer to form recesses between ends of the adjacent semiconductor channel layers of the first plurality of semiconductor channel layers; and wherein the first inner spacers are formed within the recesses between the ends of the adjacent semiconductor channel layers of the first plurality of semiconductor channel layers.

6. The method of claim 5, wherein the recessing the dielectric layer includes performing a vapor dilute hydrofluoric (dHF) acid etch.

7. The method of claim 1, further comprising:

after forming the first inner spacers and while the second fin remains masked, epitaxially growing first source/drain features in first source/drain regions of the first fin.

8. The method of claim 7, further comprising:

after epitaxially growing the first source/drain features, exposing the second fin and masking the first fin, wherein while the first fin is masked the method further comprises:

recessing the second plurality of dummy layers from the second type device region to form recesses between ends of the adjacent semiconductor channel layers of the second plurality of semiconductor channel layers; and forming second inner spacers within the recesses between the ends of the adjacent semiconductor channel layers of the second plurality of semiconductor channel layers.

9. The method of claim 8, further comprising:

after forming the second inner spacers and while the first fin remains masked, epitaxially growing second source/drain features in second source/drain regions of the second fin.

10. The method of claim 9, further comprising:

after epitaxially growing the second source/drain features, exposing the first fin;

removing the dielectric layer from the first channel region to form a second gap between adjacent semiconductor channel layers of the first plurality of semiconductor channel layers; and removing the recessed second plurality of dummy layers from a second channel region of the second type device region to form a third gap between adjacent semiconductor channel layers of the second plurality of semiconductor channel layers.

11. The method of claim 10, further comprising:

forming a first metal gate structure within the second gap between the adjacent semiconductor channel layers of the first plurality of semiconductor channel layers and abutting the first inner spacers; and forming a second metal gate structure within the third gap between the adjacent semiconductor channel layers of the second plurality of semiconductor channel layers and abutting the second inner spacers.

12. A method, comprising:

providing a first fin structure including epitaxial layers of a first composition interposed by epitaxial layers of a second composition and a second fin structure including epitaxial layers of the first composition interposed by epitaxial layers of the second composition;

forming a first dummy gate over the first fin structure and a first spacer layer on sidewalls of the first dummy gate, and a second dummy gate over the second fin structure and a second spacer layer on sidewalls of the second dummy gate;

replacing, within the first fin structure, the epitaxial layers of the second composition with disposable interposers disposed beneath the first dummy gate and first inner spacers on opposing ends of the disposable interposers and beneath the first spacer layer;

etching back, within the second fin structure, opposing lateral ends of the epitaxial layers of the second composition to form recesses disposed beneath the second spacer layer and between adjacent epitaxial layers of the first composition; and forming second inner spacers, within the second fin structure, within each of the recesses on the opposing lateral ends of the epitaxial layers of the second composition.

13. The method of claim 12, wherein the disposable interposers include an oxide layer or a nitride layer.

14. The method of claim 12, wherein the etched back epitaxial layers of the second composition, within the second fin structure, provide SiGe interposers.

15. The method of claim 12, wherein a P-type device includes the first fin structure, and wherein an N-type device includes the second fin structure.

16. The method of claim 12, further comprising:

after forming the first inner spacers and the second inner spacers, removing the first dummy gate from over the first fin structure and the second dummy gate from over the second fin structure, wherein the removing the first dummy gate also removes the disposable interposers to form a first gap between adjacent epitaxial layers of the first composition within the first fin structure; and after removing the second dummy gate, removing the etched back epitaxial layers of the second composition to form a second gap between adjacent epitaxial layers of the first composition within the second fin structure.

17. The method of claim 16, further comprising:

forming a first metal gate structure within the first gap and abutting the first inner spacers; and forming a second metal gate structure within the second gap and abutting the second inner spacers.

18. A method, comprising:

providing a first fin in a P-type device region and a second fin in an N-type device region, wherein each of the first and second fins include a plurality of silicon (Si) channels interposed by a plurality of silicon germanium (SiGe) interposers;

replacing the plurality of SiGe interposers within the first fin with a dielectric layer and first inner spacers disposed on opposing sides of the dielectric layer;

forming second inner spacers along recessed lateral ends of the plurality of SiGe interposers within the second fin; and replacing the plurality of SiGe interposers within the second fin with respective portions of a first metal gate structure interposed between the second inner spacers;

wherein the replacing the plurality of SiGe interposers within the second fin removes a SiGe/Si intermix layer at interfaces between the plurality of Si channels and the plurality of SiGe interposers; and wherein after the replacing the plurality of SiGe interposers within the second fin, a first thickness of the plurality of Si channels in a channel region of the second fin is less than a second thickness of the plurality of Si channels outside the channel region of the second fin.

19. The method of claim 18, further comprising:

replacing the dielectric layer within the first fin with respective portions of a second metal gate structure interposed between the first inner spacers without altering a thickness of the plurality of Si channels within the first fin.

20. The method of claim 18, further comprising:

replacing the dielectric layer within the first fin with respective portions of a second metal gate structure interposed between the first inner spacers, wherein after the replacing the dielectric layer within the first fin, a third thickness of the plurality of Si channels in a channel region of the first fin is less than a fourth thickness of the plurality of Si channels outside the channel region of the first fin, and wherein the third thickness is greater than the first thickness.

* * * * *